US008269757B2

(12) United States Patent
Ko

(10) Patent No.: US 8,269,757 B2
(45) Date of Patent: Sep. 18, 2012

(54) LCD DRIVING METHOD USING SELF-MASKING, AND MASKING CIRCUIT AND ASYMMETRIC LATCHES THEREOF

(75) Inventor: Jae-hong Ko, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1218 days.

(21) Appl. No.: 12/077,518

(22) Filed: Mar. 19, 2008

(65) Prior Publication Data

US 2008/0231623 A1 Sep. 25, 2008

(30) Foreign Application Priority Data

Mar. 20, 2007 (KR) ........................ 10-2007-0027225

(51) Int. Cl.
*G09G 3/36* (2006.01)
(52) U.S. Cl. .......... 345/211; 345/100; 345/98; 345/690; 345/698; 345/204; 345/87; 345/99
(58) Field of Classification Search .................. 345/100, 345/98, 690, 698, 204, 87, 99, 211; 326/83
See application file for complete search history.

(56) References Cited

U.S. PATENT DOCUMENTS

| 6,057,822 A | 5/2000 | Tsubota |
| 7,522,148 B2 * | 4/2009 | Maki .............................. 345/100 |
| 2007/0001980 A1 | 1/2007 | Bae |
| 2008/0211790 A1 * | 9/2008 | Jung et al. ...................... 345/204 |

FOREIGN PATENT DOCUMENTS

| JP | 11-143432 | 5/1999 |
| JP | 2005-84559 | 3/2005 |
| KR | 10-2004-0061494 | 7/2004 |
| KR | 10-2007-0002955 | 1/2007 |

OTHER PUBLICATIONS

Chinese Office Action dated Aug. 24, 2011 issued in the corresponding Chinese Application.

* cited by examiner

*Primary Examiner* — Lun-Yi Lao
*Assistant Examiner* — Olga Merkoulova
(74) *Attorney, Agent, or Firm* — Onello & Mello LLP

(57) ABSTRACT

Provided are a method of driving a liquid crystal panel using self-masking, a masking circuit for performing the method, and asymmetric latches. The method includes supplying power to the liquid crystal panel; receiving a horizontal start pulse signal instructing source lines of the liquid crystal panel to be driven, from a timing controller; generating a horizontal start masking signal by masking at least one pulse of the horizontal start pulse signal; and driving the source lines in response to the horizontal start masking signal. The horizontal start masking signal turns off the switches until signals output from the source driver, which correspond to image data of the liquid crystal panel, are supplied. Accordingly, it is possible to prevent unknown image data from being displayed on the liquid crystal display when the liquid crystal panel is powered on.

51 Claims, 12 Drawing Sheets

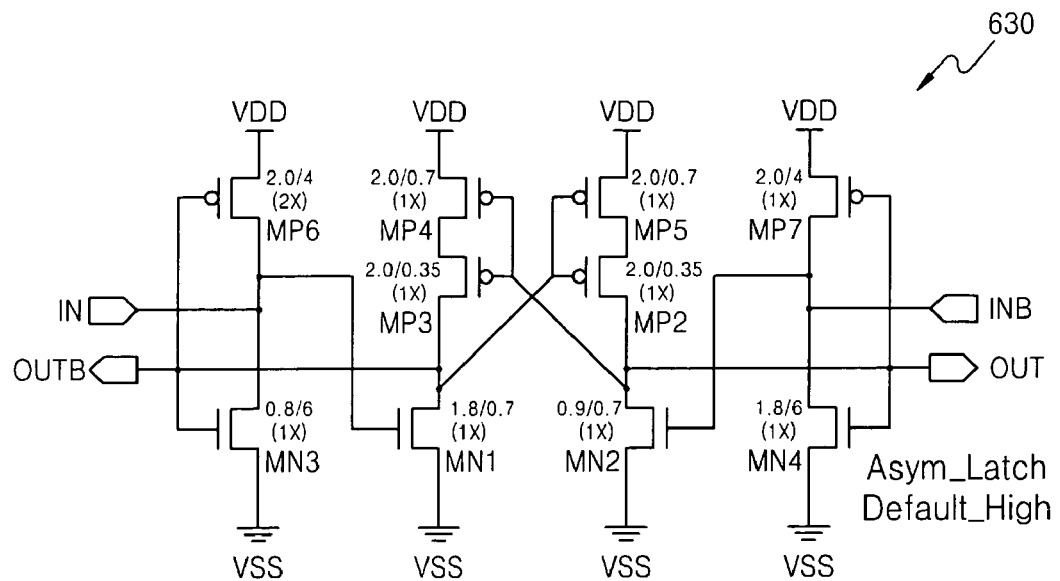
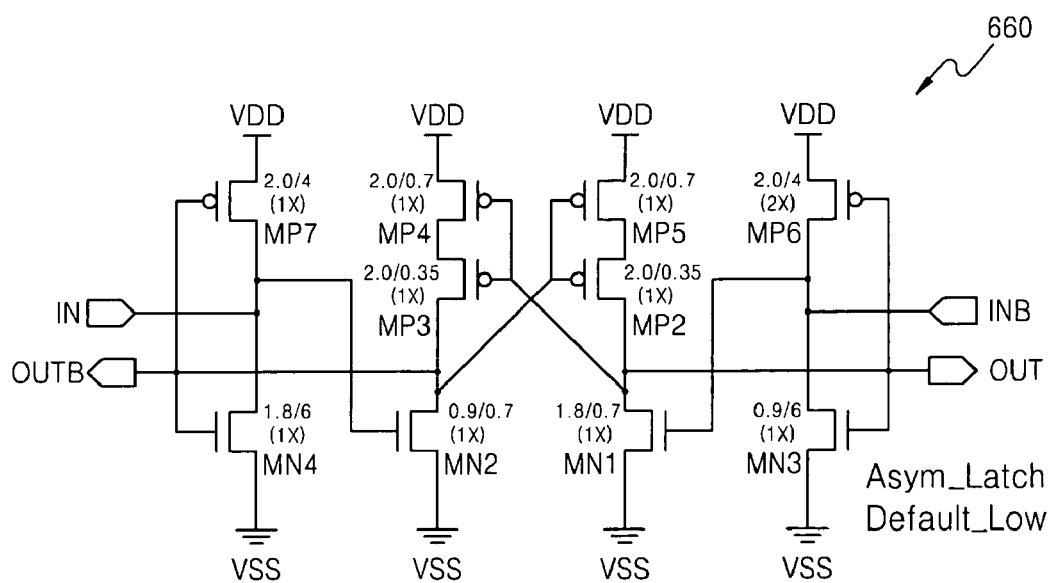

LCD DRIVING METHOD USING SELF-MASKING, AND MASKING CIRCUIT AND ASYMMETRIC LATCHES THEREOF

CROSS-REFERENCE TO RELATED PATENT APPLICATIONS

This application claims the benefit of priority to Korean Patent Application No. 10-2007-0027225, filed on Mar. 20, 2007, in the Korean Intellectual Property Office, the disclosure of which is incorporated herein in its entirety by reference.

BACKGROUND OF THE INVENTION

1. Field of the Invention

The present invention relates to a semiconductor integrated circuit, and more particularly, to a liquid crystal display (LCD) or panel driving apparatus with a self-masking function.

2. Description of the Related Art

A liquid crystal panel displays image data using a matrix of pixels, each located at an intersection of a gate line and a source line. Each pixel includes a liquid crystal cell that adjusts the amount of light transmission according to the image data, and a thin film transistor that transmits the image data from a source line to the liquid crystal cell. A liquid crystal panel module includes a gate driver and a source driver that respectively drive the gate line and the source line.

FIG. 1 illustrates the power-on sequence timing of a conventional liquid crystal panel module. Referring to FIG. 1, a first supply voltage VDD1 and a second supply voltage VDD2 output from a source driver are supplied at a point of time t1. The first supply voltage VDD1 is a voltage for driving a logic circuit of the source driver, and the second supply voltage VDD2 is a high voltage for driving the source driver. Both the first supply voltage VDD1 and the second supply voltage VDD2 are stabilized at a point of time t2. A timing controller transmits image data to the source driver after several frames a reset signal RESET output from the timing controller that controls the liquid crystal panel module transitions from a logic low level to a logic high level. A horizontal start pulse signal TP output from the timing controller that drives source lines of a liquid crystal panel, and signals output from the source driver that correspond to the image data are supplied at a point of time t3.

The horizontal start pulse signal TP, which controls switches that transmit the signals output from the source driver to the source lines, turns on the switches at logic low. The horizontal start pulse signal TP that goes low is supplied between the points of time t1 and t3 before the signals output from the source driver are supplied and, thus, unknown signals output from the unstable source driver are transmitted to the source lines. Thus, stripes appear on the liquid crystal panel during an initial power-on stage, causing a display failure as illustrated in FIG. 2. The display state of the liquid crystal panel returns to a normal state at the point of time t3 after several tens of milliseconds.

Accordingly, there is a growing need for a method of preventing unknown image data from being displayed on the liquid crystal panel during the initial power-on stage.

SUMMARY OF THE INVENTION

In accordance with aspects of the present invention, provided is a method of driving a liquid crystal display or panel using a horizontal start-masking signal during an initial power-on stage.

Also in accordance with aspects of the present invention, provided is a masking circuit configured to generate the horizontal start-masking signal.

Also in accordance with aspects of the present invention, the masking circuit can comprise asymmetric latches.

According to an aspect of the present invention, there is provided a method of driving a liquid crystal panel, the method comprising supplying power to the liquid crystal panel; receiving from a timing controller a horizontal start pulse signal instructing source lines of the liquid crystal panel to be driven; generating a horizontal start masking signal by masking at least one pulse of the horizontal start pulse signal; and driving the source lines in response to the horizontal start masking signal.

The method can include controlling switches between the source lines of the liquid crystal panel and a source driver with the horizontal start masking signal.

The method can include using the horizontal start masking signal to turn off the switches until signals output from the source driver and correspond to image data of the liquid crystal panel, are supplied.

According to another aspect of the present invention, there is provided a method of driving a liquid crystal panel, the method comprising supplying power to the liquid crystal panel; sequentially receiving from a timing controller a horizontal start pulse signal instructing source lines of the liquid crystal panel to be driven; generating a divided-by 2 pulse signal whose logic level is inverted at each rising edge of the horizontal start pulse signal; generating a divided-by 4 pulse signal whose logic level is inverted at each rising edge of the divided-by 2 pulse signal; generating a divided-by 8 pulse signal whose logic level is inverted at each rising edge of the divided-by 4 pulse signal; generating a delayed divided-by 8 pulse signal by delaying the divided-by 8 pulse signal for a predetermined length of time; generating an enable signal which transitions to logic low at a falling edge of the delayed divided-by 8 pulse signal; generating a horizontal start masking signal by performing an OR operation on the enable signal and the horizontal start pulse signal; and controlling switches between the source lines of the liquid crystal panel and a source driver, in response to the horizontal start masking signal.

The method can include using the horizontal start masking signal to turn off the switches until signals output from the source driver, which correspond to image data of the liquid crystal panel, are supplied.

According to another aspect of the present invention, there is provided a masking circuit comprising a first flip-flop configured to receive a horizontal start pulse signal via a clock input terminal, and to respectively output a divided-by 2 pulse signal and an inverted divided-by 2 pulse signal via an output terminal and an inverted output terminal; a second flip-flop configured to receive the divided-by 2 pulse signal via a clock input terminal, and to output a divided-by 4 pulse signal via an output terminal; a third flip-flop configured to receive the divided-by 4 pulse signal via a clock input terminal, and to output a divided-by 8 pulse signal via an output terminal; a delay unit configured to delay the divided-by 8 pulse signal for a predetermined length of time, and to output a delayed divided-by 8 pulse signal; a fourth flip-flop configured to receive the delayed divided-by 8 pulse signal via a clock input terminal, the divided-by 2 pulse signal via a data input terminal, and the inverted divided-by 2 pulse signal via an inverted data input terminal, and to output an enable signal via an inverted output terminal; and an OR gate configured to receive the horizontal start pulse signal and the enable signal, and to generate a horizontal start masking signal.

Each of the first, second, and third flip-flops can comprise first and second switches respectively configured to transmit the signals of the inverted output terminal and the output terminal of the flip-flop, in response a signal of an inverted clock input terminal; a default high latch having an output terminal that is set at a default logic low level, and that is configured to respectively transmit to an input terminal and an inverted input terminal the signal of the inverted output terminal received from the first switch and the signal of the output terminal received from the second switch; third and fourth switches configured to respectively transmit the signals of the inverted output terminal and the output terminal of the default high latch, in response to a signal of the clock input terminal; and a default low latch having an output terminal that is set at a default logic low level, and that is configured to respectively receive the signal of the inverted output terminal transmitted via the third switch and the signal of the output terminal transmitted via the fourth switch, via an input terminal and an inverted input terminal, where an inverted output terminal and the output terminal of the default low latch are connected to the output terminal and the inverted output terminal of each of the first through third flip-flops.

The fourth flip-flop can comprise first and second switches configured to respectively transmit the signals of the data input terminal and the inverted data input terminal of the fourth flip-flop, in response to a signal of the clock input terminal; a default low latch having an output terminal that is set at a default logic low level, and that is configured to respectively receive the signal of the data input terminal transmitted via the first switch and the signal of the inverted data input terminal transmitted via the second switch, via an input terminal and an inverted input terminal; third and fourth switches configured to respectively transmit the signals of the inverted output terminal and the output terminal of the default low latch, in response to a signal of the inverted clock input terminal; and a default high latch having an output terminal that is set at a default logic high level, and that is configured to respectively receive the signal of the inverted output terminal transmitted via the third switch and the signal of the output terminal transmitted via the fourth switch, via an input terminal and an inverted input terminal, where an inverted output terminal and the output terminal of the default high latch are connected to the output terminal and the inverted output terminal of the fourth flip-flop.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. The width of the first NMOS transistor can be greater than the width of the second NMOS transistor, and the size of the fifth PMOS transistor can be greater than the size of the sixth PMOS transistor.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the first NMOS transistor can be greater than the width of the second NMOS transistor, and the size of the fifth PMOS transistor can be greater than the size of the sixth PMOS transistor.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the first NMOS transistor can be greater than the width of the second NMOS transistor, and the size of the third PMOS transistor can be greater than the size of the fourth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. The width of the second NMOS transistor can be greater than the width of the first NMOS transistor, and the size of the sixth PMOS transistor can be greater than the size of the fifth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the second NMOS transistor can be greater than the width of the first NMOS transistor, and the size of the sixth PMOS transistor can be greater than the size of the fifth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the second NMOS transistor can be greater than the width of the first NMOS transistor, and the size of the fourth PMOS transistor can be greater than the size of the fifth PMOS transistor.

According to another aspect of the present invention, there is provided a masking circuit comprising a first flip-flop configured to receive a horizontal start pulse signal via a clock input terminal, and to output a divided-by 2 pulse signal via an output terminal; an inverter configured to receive the horizontal start pulse signal and to generate an inverted horizontal start pulse signal; a second flip-flop configured to receive the divided-by 2 pulse signal via a clock input terminal, the horizontal start pulse signal via a data input terminal, and the inverted horizontal start pulse signal via an inverted data input terminal, and to output an enable signal via an inverted output terminal; and an OR gate configured to receive the horizontal start pulse signal and the enable signal, and to generate a horizontal start masking signal.

The first flip-flop can comprise first and second switches configured to respectively transmit a signal of an inverted output terminal and a signal of the output terminal of the first flip-flop, in response to a signal of an inverted clock input terminal; a default high latch having an output terminal that is set at a default logic high level, and that is configured to respectively receive the signal of the inverted output terminal transmitted via the first switch and the signal of the output terminal transmitted via the second switch, via an input terminal and an inverted input terminal; third and fourth switches configured to respectively transmit the signals of the inverted output terminal and the output terminal of the default high latch, in response to the signal of the clock input terminal; and a default low latch having an output terminal that is set at a default logic low level, and that is configured to respectively receive the signal of the inverted output terminal transmitted via the third switch and the signal of the output terminal transmitted via the fourth switch, via an input terminal and an inverted input terminal, where an inverted output terminal and the output terminal are connected to the output terminal and the inverted output terminal of the first flip-flop.

The second flip-flop can comprise first and second switches configured to respectively transmit the signals of the data input terminal and the inverted data input terminal of the second flip-flop, in response to the signal of the clock input terminal; a default low latch having an output terminal that is set at a default logic low level, and that is configured to respectively receive the signal of the data input terminal transmitted via the first switch and the signal of the inverted data input terminal transmitted via the second switch, via an input terminal and an inverted input terminal; third and fourth switches configured to respectively transmit the signals of the inverted output terminal and the output terminal of the default low latch, in response to a signal of an inverted clock input terminal; and a default high latch having an output terminal that is set at a default logic high level, and that is configured to respectively receive the signal of the inverted output terminal transmitted via the third switch and the signal of the output terminal transmitted via the fourth switch, via an input terminal and an inverted input terminal, wherein an inverted output terminal and the output terminal are connected to the output terminal and the inverted output terminal of the fourth flip-flop.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. The width of the first NMOS transistor can be greater than the width of the second NMOS transistor, and the size of the fifth PMOS transistor can be greater than the size of the sixth PMOS transistor.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the first NMOS transistor can be greater than the width of the second NMOS transistor, and the size of the fifth PMOS transistor can be greater than the size of the sixth PMOS transistor.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the first NMOS transistor can be greater than the width of the second NMOS transistor, and the size of the third PMOS transistor can be greater than the size of the fourth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. The width of the second NMOS transistor can be greater than the width of the first NMOS transistor, and the size of the sixth PMOS transistor can be greater than the size of the fifth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the second NMOS transistor can be greater than the width of the first NMOS transistor, and the size of the sixth PMOS transistor can be greater than the size of the fifth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the second NMOS transistor can be greater than the width of the first NMOS transistor, and the size of the fourth PMOS transistor can be greater than the size of the fifth PMOS transistor.

According to another aspect of the present invention, there is provided a masking circuit comprising an inverter configured to receive a horizontal start pulse signal and to output an inverted horizontal start pulse signal; a flip-flop configured to receive the horizontal start pulse signal via a clock input terminal, the horizontal start pulse signal via a data input terminal, and the inverted horizontal start pulse signal via an inverted data input terminal, and to output an enable signal via an inverted output terminal; and an OR gate configured to receive the horizontal start pulse signal and the enable signal, and to generate a horizontal start masking signal.

The masking circuit can further comprise a delay unit configured to receive the horizontal start pulse signal and to generate a delayed horizontal start pulse signal. The delayed horizontal start pulse signal is supplied to the clock input terminal of the flip-flop.

In various masking circuits above, the flip-flop can comprise first and second switches configured to respectively transmit signals of the data input terminal and the inverted data input terminal of the flip-flop, in response to a signal of the clock input terminal; a default low latch having an output terminal that is set at a default logic low level, and that is configured to respectively receive a signal of the data input terminal transmitted via the first switch and the signal of the inverted data input terminal transmitted via the second switch, via an input terminal and an inverted input terminal; third and fourth switches configured to respectively transmit signals of the inverted output terminal and the output terminal of the default low latch, in response to a signal of an inverted clock input terminal; and a default high latch having an output terminal that is set in a default logic high level, and that is configured to respectively receive the signal of the inverted output terminal transmitted via the third switch and the signal of the output terminal transmitted via the fourth switch, via an input terminal and an inverted input terminal, where an inverted output terminal and the output terminal are connected to the output terminal and the inverted output terminal of the fourth flip-flop.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor.

The width of the first NMOS transistor can be greater than the width of the second NMOS transistor, and the size of the fifth PMOS transistor can be greater than the size of the sixth PMOS transistor.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the first NMOS transistor can be greater than the width of the second NMOS transistor, and the size of the fifth PMOS transistor can be greater than the size of the sixth PMOS transistor.

In various masking circuits above, the default high latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the first NMOS transistor can be greater than the width of the second NMOS transistor, and the size of the third PMOS transistor can be greater than the size of the fourth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. The width of the second NMOS transistor can be greater than the width of the first NMOS transistor, and the size of the sixth PMOS transistor can be greater than the size of the fifth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the second NMOS transistor can be greater than the width of the first NMOS transistor, and the size of the sixth PMOS transistor can be greater than the size of the fifth PMOS transistor.

In various masking circuits above, the default low latch can comprise a first NMOS transistor whose source is connected to a ground voltage source, gate is connected to the input terminal of the default high latch, and drain is connected to the inverted output terminal; a second NMOS transistor whose source is connected to the ground voltage source, gate is connected to the inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. The width of the second NMOS transistor can be greater than the width of the first NMOS transistor, and the size of the fourth PMOS transistor can be greater than the size of the fifth PMOS transistor.

According to another aspect of the present invention, there is provided a latch having an output terminal that is set at a default logic high level, the latch comprising a first NMOS transistor whose source is connected to a ground voltage source, gate is connected to an input terminal of the latch, and drain is connected to an inverted output terminal of the latch; a second NMOS transistor whose source is connected to the ground voltage source, gate is connected to an inverted input terminal, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. Here, the width of the first NMOS transistor is greater than the width of the second NMOS transistor, and the size of the fifth PMOS transistor is greater than the size of the sixth PMOS transistor.

According to another aspect of the present invention, there is provided a latch having an output terminal that is set at a default logic high level, the latch comprising a first NMOS transistor whose source is connected to a ground voltage source, gate is connected to an input terminal of the latch, and drain is connected to an inverted output terminal of the latch; a second NMOS transistor whose source is connected to the ground voltage source, gate is connected to an inverted input terminal of the latch, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. Here, the width of the first NMOS transistor is greater than the width of the second NMOS transistor, and the size of the fifth PMOS transistor is greater than the size of the sixth PMOS transistor.

According to another aspect of the present invention, there is provided a latch having an output terminal that is set at a default logic high level, the latch comprising a first NMOS transistor whose source is connected to a ground voltage source, gate is connected to an input terminal of the latch, and drain is connected to an inverted output terminal of the latch; a second NMOS transistor whose source is connected to the ground voltage source, gate is connected to an inverted input terminal of the latch, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. Here, the width of the first NMOS transistor is greater than the width of the second NMOS transistor, and the size of the third PMOS transistor is greater than the size of the fourth PMOS transistor.

According to another aspect of the present invention, there is provided a latch having an output terminal that is set at a default logic low level, the latch comprising a first NMOS transistor whose source is connected to a ground voltage source, gate is connected to an input terminal of the latch, and drain is connected to an inverted output terminal of the latch; a second NMOS transistor whose source is connected to the ground voltage source, gate is connected to an inverted input terminal of the latch, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor. Here, the width of the second NMOS transistor is greater than the width of the first NMOS transistor, and the size of the sixth PMOS transistor is greater than the size of the fifth PMOS transistor.

According to another aspect of the present invention, there is provided a latch having an output terminal that is set at a default logic low level, the latch comprising a first NMOS transistor whose source is connected to a ground voltage source, gate is connected to an input terminal of the latch, and drain is connected to an inverted output terminal of the latch; a second NMOS transistor whose source is connected to the ground voltage source, gate is connected to an inverted input terminal of the latch, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source and gate is connected to the output terminal; a second PMOS transistor whose source is connected to the drain of the first PMOS transistor, gate is connected to the output terminal, and drain is connected to the drain of the first NMOS transistor; a third PMOS transistor whose source is connected to the supply voltage source and gate is connected to the inverted output terminal; a fourth PMOS transistor whose source is connected to the drain of the third PMOS transistor, gate is connected to the inverted output terminal, and drain is connected to the drain of the second NMOS transistor; a fifth PMOS transistor whose source is connected to the supply voltage source and gate is connected to the inverted output terminal; a first switching PMOS transistor whose source is connected to the drain of the fifth PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a sixth PMOS transistor whose source is connected to the supply voltage source and gate is connected to the output terminal; a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. Here, the width of the second NMOS transistor is greater than the width of the first NMOS transistor, and the size of the sixth PMOS transistor is greater than the size of the fifth PMOS transistor.

According to another aspect of the present invention, there is provided a latch having an output terminal that is set at a default logic low level, the latch comprising a first NMOS transistor whose source is connected to a ground voltage source, gate is connected to an input terminal of the latch, and drain is connected to an inverted output terminal of the latch; a second NMOS transistor whose source is connected to the ground voltage source, gate is connected to an inverted input terminal of the latch, and drain is connected to the output terminal; a third NMOS transistor whose source is connected to the ground voltage source, gate is connected to the inverted output terminal, and drain is connected to the input terminal; a fourth NMOS transistor whose source is connected to the ground voltage source, gate is connected to the output terminal, and drain is connected to the inverted input terminal; a first PMOS transistor whose source is connected to a supply voltage source, gate is connected to the output terminal, and drain is connected to the drain of the first NMOS transistor; a second PMOS transistor whose source is connected to the supply voltage source, gate is connected to the inverted output terminal, and drain is connected to the drain of the second NMOS transistor; a third PMOS transistor whose source is connected to the supply voltage source and gate is connected to the inverted output terminal; a first switching PMOS transistor whose source is connected to the drain of the third PMOS transistor, gate is connected to the inverted clock input terminal, and drain is connected to the input terminal; a first switching NMOS transistor whose drain is connected to the drain of the first switching PMOS transistor, gate is connected to the clock input terminal, and source is connected to the drain of the third NMOS transistor; a fourth PMOS transistor whose source is connected to the supply voltage source and gate is connected to the output terminal; a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor. Here, the width of the second NMOS transistor is greater than the width of the first NMOS transistor, and the size of the fourth PMOS transistor is greater than the size of the fifth PMOS transistor.

According to the present invention, a horizontal start masking signal is generated by masking at least one pulse of a horizontal start pulse signal output from a timing controller, using asymmetric latches each having an output terminal that is set at a default logic high level or at a default logic low level. The horizontal start masking signal turns off switches between source lines of a liquid crystal panel and a source driver until signals output from the source driver that correspond to image data of the liquid crystal panel are supplied. Accordingly, it is possible to prevent unknown image data from being displayed on the liquid crystal panel when a liquid crystal panel is powered on.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings:

FIG. 7 is a circuit diagram illustrating an embodiment of a first latch illustrated in FIG. 6, according to an aspect of the present invention;

FIG. 8 is a circuit diagram illustrating an embodiment of a second latch illustrated in FIG. 6, according to an aspect of the present invention;

DETAILED DESCRIPTION OF PREFERRED EMBODIMENTS

Figure 1:
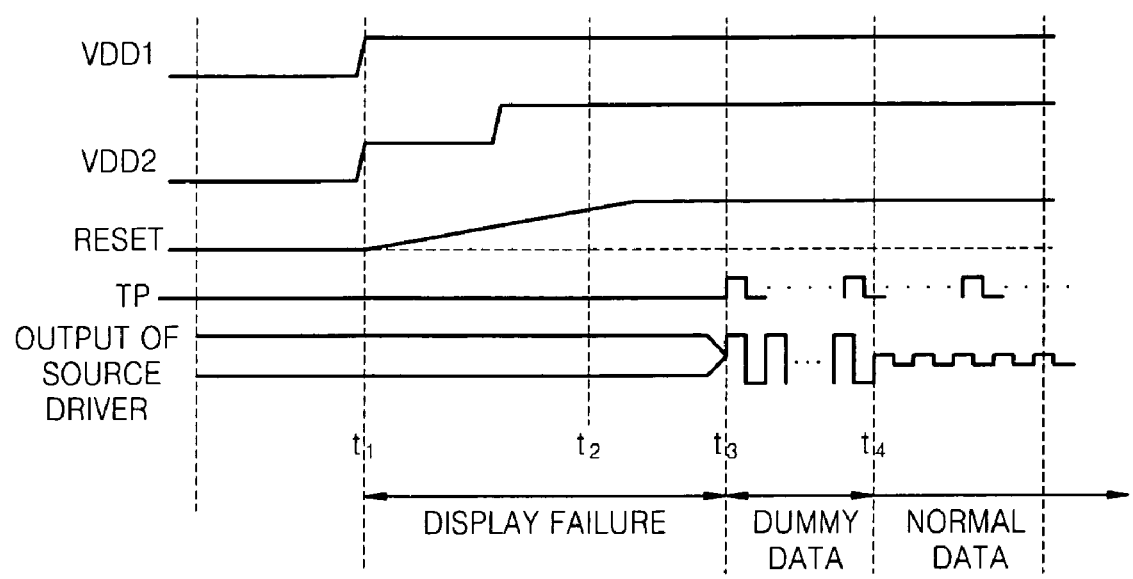
FIG. 1 illustrates a power-on sequence timing of a conventional liquid crystal panel module.
Figure 2:
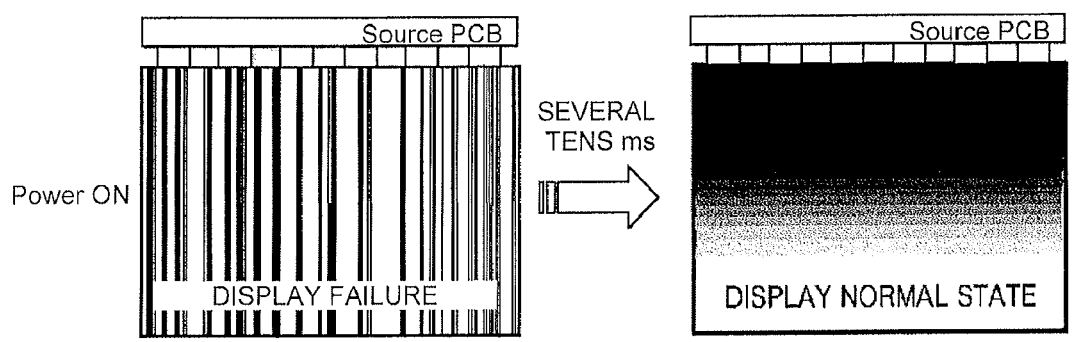
FIG. 2 illustrates a display failure occurring in a liquid crystal panel described with reference to FIG. 1 during an initial power-on stage.

The present invention will now be described more fully with reference to the accompanying drawings, in which exemplary embodiments in accordance with aspects of the invention are shown. Like reference numerals denote like elements throughout the drawings.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 3:
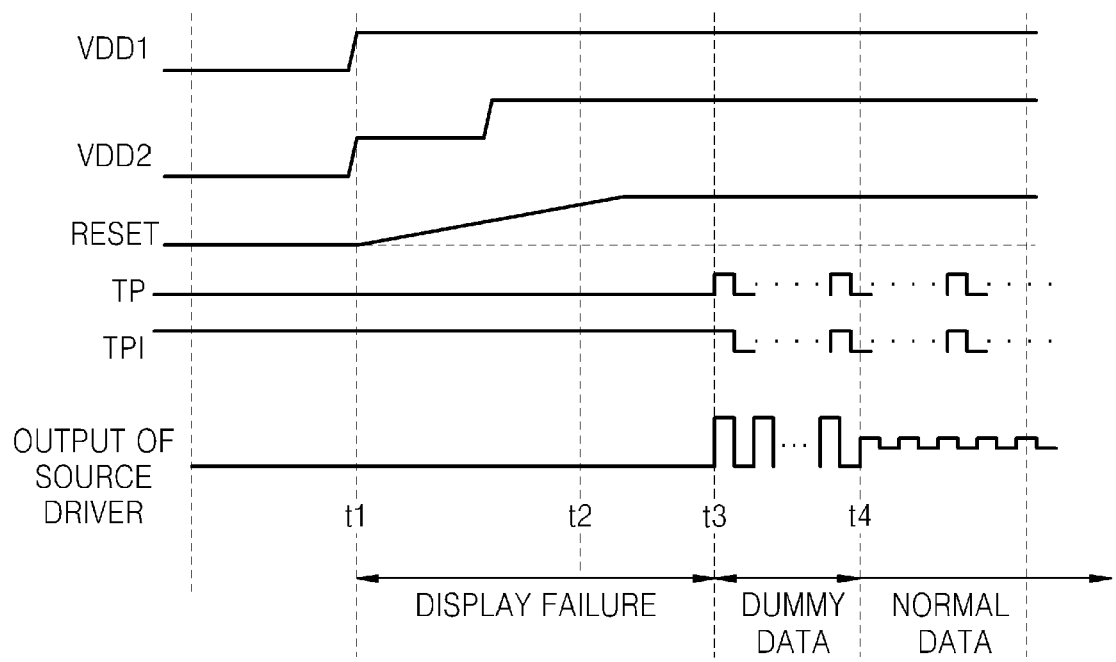
FIG. 3 illustrates a power-on sequence timing of an embodiment of a liquid crystal panel module according to an aspect of the present invention.

FIG. 3 illustrates a power-on sequence timing of an embodiment of a liquid crystal panel module according to an aspect of the present invention. Referring to FIG. 3, a first supply voltage VDD1 and a second supply voltage VDD2 output from a source driver are supplied at a point of time t1 and stabilized at a point of time t2. A horizontal start pulse signal TP and signals output from the source driver, which correspond to image data, are supplied at a point in time t3 several frames after a reset signal RESET output from a timing controller transitions from logic low to logic high. A horizontal start-masking signal TPI is generated from the horizontal start pulse signal TP in order to prevent unknown signals output from the source driver from being transmitted to source lines between the points of time t1 and t3.

The horizontal start-masking signal TPI that goes high is generated during an initial power-on stage, and its logic level changes to be the same as the logic level of the horizontal start pulse signal TP at the point of time t3. The horizontal start masking signal TPI controls switches configured to transmit the signals output from the source driver to the source lines, and substantially has the same function as the horizontal start pulse signal TP output from a timing controller. The horizontal start-masking signal TPI turns off the switches at a logic high level, and turns them on at a logic low level.

Figure 4:
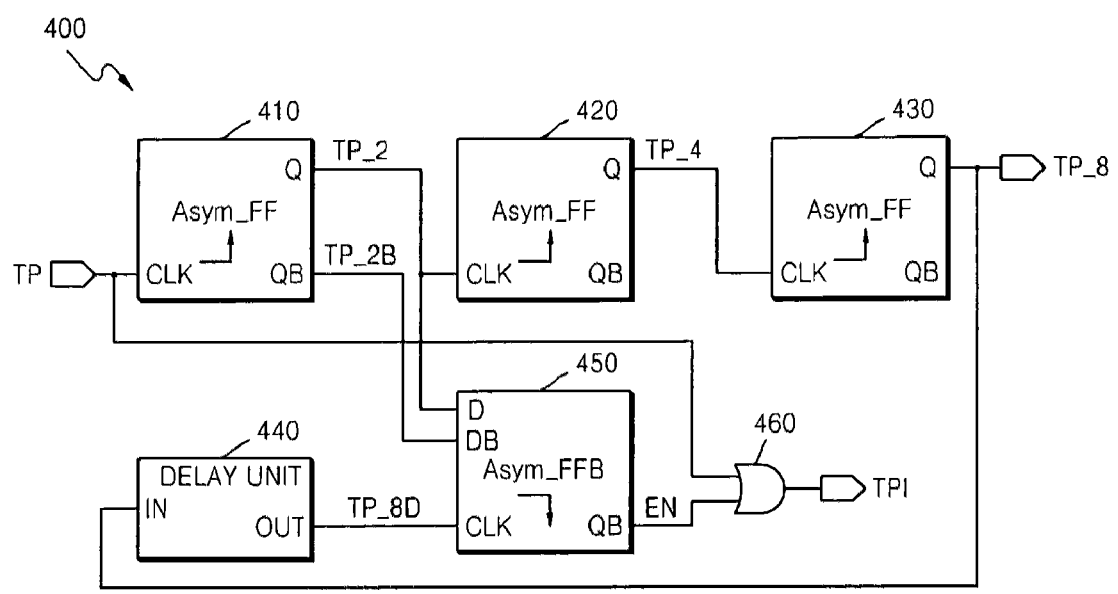
FIG. 4 is a circuit diagram of an embodiment of a masking circuit configured to generate a horizontal start-masking signal illustrated in FIG. 3, according to an aspect of the present invention.

FIG. 4 is a circuit diagram of an embodiment of a masking circuit configured to generate a horizontal start-masking signal illustrated in FIG. 3, according to an aspect of the present invention. Referring to FIG. 4, the horizontal start-masking signal TPI is generated by masking circuit 400 illustrated in FIG. 4. The masking circuit 400 includes first through fourth flip-flops 410, 420, 430, and 450, which are asymmetric latches, a delay unit 440, and an OR gate 460. The first through third flip-flops 410, 420, and 430 respectively generate a divided-by 2 pulse signal TP_2, a divided-by 4 pulse signal TP_4, and a divided-by 8 pulse signal TP_8, which are generated by dividing the horizontal start pulse signal TP. The first flip-flop 410 receives the horizontal start pulse signal TP via a clock input terminal CLK, and respectively outputs the divided-by 2 pulse signal TP_2 and an inverted divided-by 2 pulse signal TP_2B via a output terminal Q and an inverted output terminal QB, respectively. The second flip-flop 420 receives the divided-by 2 pulse signal TP_2 via a clock input terminal CLK, and outputs the divided-by 4 pulse signal TP_4 via an output terminal Q. The third flip-flop 430 receives the divided-by 4 pulse signal TP_4 via the clock input terminal CLK, and outputs the divided-by 8 pulse signal TP_8 via an output terminal Q.

The delay unit 440 receives the divided-by 8 pulse signal TP_8 and outputs a delayed divided-by 8 pulse signal TP_8D. The fourth flip-flop 450 receives the divided-by 8 pulse signal TP_8D via a clock input terminal CLK, the divided-by 2 pulse signal TP_2 via a data input terminal D, and the inverted divided-by 2 pulse signal TP_2B via an inverted data input terminal DB, and outputs an enable signal EN via an inverted output terminal QB. The OR gate 460 receives the horizontal start pulse signal TP and the enable signal EN, and generates the horizontal start masking signal TPI.

Figure 5:
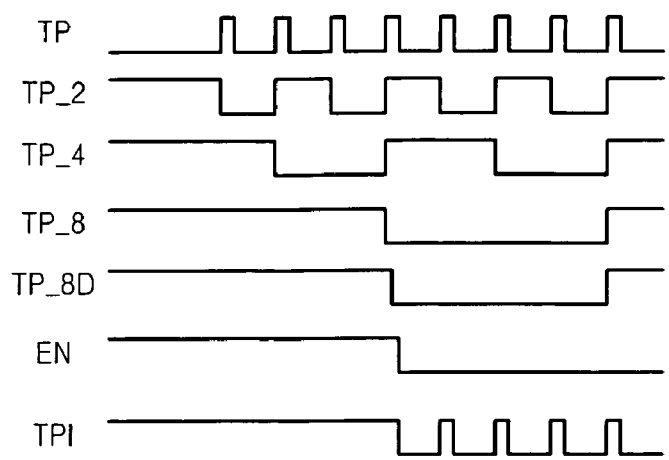
FIG. 5 is an operating timing diagram of the masking circuit of FIG. 4, according to an aspect of the present invention.

FIG. 5 illustrates an operating timing of the masking circuit 400 of FIG. 4, according to an aspect of the present invention. Referring to FIG. 5, if a horizontal start pulse signal TP output from a timing controller is sequentially input, a divided-by 2 pulse signal TP_2 transitions from an initial logic high level to a logic low level at a rising edge of the horizontal start pulse signal TP. Then, the logic level of the divided-by 2 pulse signal TP_2 is inverted at each rising edge of the horizontal start pulse signal TP. A divided-by 4 pulse signal TP_4 transitions from an initial logic high level to a logic low level at a rising edge of the divided-by 2 pulse signal TP_2. Then, the logic level of the divided-by 4 pulse signal TP_4 is inverted at each rising edge of the divided-by 2 pulse signal TP_2. A divided-by 8 pulse signal TP_8 transitions from an initial logic high level to a logic low level at a rising edge of the divided-by 4 pulse signal TP_4. Then, the logic level of the divided-by 8 pulse signal TP_8 is inverted at each rising edge of the divided-by 4 pulse signal TP_4. The divided-by 8 pulse signal TP_8 is delayed for a predetermined length of time, thus generating a delayed divided-by 8 pulse signal TP_8D. An enable signal EN transitions from an initial logic high level to a logic low level at a falling edge of the delayed divided-by 8 pulse signal TP_8D. A horizontal start masking signal TPI is generated by performing an OR operation on the enable signal EN that goes low and the horizontal start pulse signal TP. Accordingly, a horizontal start masking signal TPI whose logic level changes to be the same as that of the horizontal start pulse signal TP is generated by masking the first four pulses of the horizontal start pulse signal TP at a logic high level.

Figure 6:
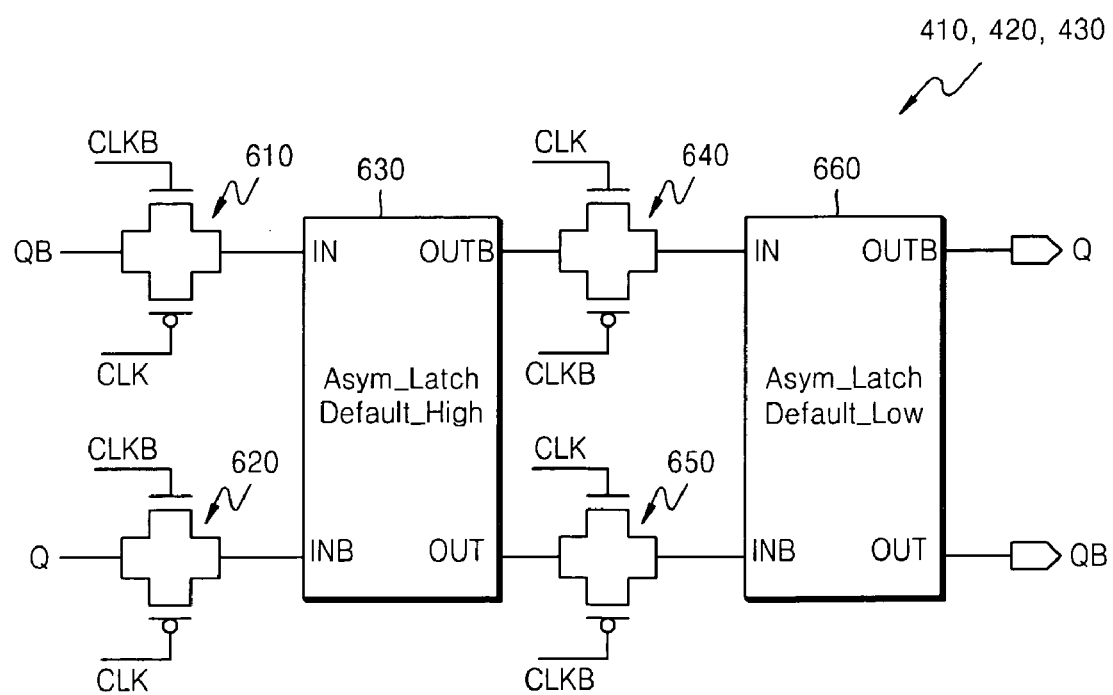
FIG. 6 is a circuit diagram illustrating an embodiment of first through third flip-flops illustrated in FIG. 4, according to an aspect of the present invention.

FIG. 6 is a circuit diagram illustrating embodiments of the first flip-flop 410 (or the second or third flip-flop 420 or 430) of FIG. 4, according to an aspect of the present invention. Referring to FIG. 6, the first flip-flop 410 (or the second or third flip-flop 420 or 430, respectively) includes a first switch 610 that transmits a signal of an inverted output terminal QB in response to an inverted clock terminal signal CLKB, and a second switch 620 that transmits a signal of an output terminal Q in response to the inverted clock terminal CLKB. The signal of the inverted output terminal QB transmitted via the first switch 610 and the signal of the output terminal Q transmitted via the second switch 620 are respectively supplied to an input terminal IN and an inverted input terminal INB of a first latch 630. The first latch 630 is an asymmetric latch, and an output terminal OUT of the first latch 630 is set in a default logic high state in this embodiment. A signal of an inverted output terminal OUTB and a signal of an output terminal OUT output from the first latch 630 are respectively supplied to an input terminal IN and an inverted input terminal INB of a second latch 660 via third and fourth switches 640 and 650, respectively, in response to a clock terminal signal CLK. A signal of an inverted output terminal OUTB and a signal of an output terminal OUT output from the second latch 660 are respectively supplied to the output terminal Q and the inverted output terminal QB of the first flip-flop 410 (or the second or third flip-flop 420 or 430). The second latch 660 is an asymmetric latch, and an output terminal OUT of the second latch 660 is set in a default logic low state. The signal of the inverted output terminal OUTB and the signal of the output terminal OUT output from the second latch 660 respectively become a signal of an output terminal Q and a signal of an inverted output terminal QB of the first flip-flop 410 (or the second or third flip-flop 420 or 430).

FIG. 7 is a circuit diagram illustrating an embodiment of the first latch 630, illustrated in FIG. 6, which is set at a default logic high state, according to an aspect of the present invention. Referring to FIG. 7, the first latch 630 has a feedback inverter structure in which input terminals IN and INB are respectively connected to output terminals OUT and OUTB in a feedback manner. The first latch 630 includes MN1, MN2, MN3, and MN4 NMOS transistors whose sources are connected to a ground voltage source VSS. A signal at the input terminal IN is supplied to a gate of the MN1 NMOS transistor, and a signal at the inverted output terminal OUTB is supplied to a drain of the MN1 NMOS transistor. A signal at the inverted input terminal INB is supplied to a gate of the MN2 NMOS transistor, and a signal at the output terminal OUT is supplied to a drain of the MN2 NMOS transistor. A signal at the inverted output terminal OUTB is supplied to a gate of the MN3 NMOS transistor, and the signal of the input terminal IN is supplied to a drain of MN3 NMOS transistor. The signal of the output terminal OUT is supplied to a gate of the MN4 NMOS transistor, and the signal of the inverted input terminal INB is supplied to a drain of the MN4 NMOS transistor.

The MP4 and MP3 PMOS transistors are connected in series between a supply voltage source VDD and the drain of the MN1 NMOS transistor. The gates of the MP4 and MP3 PMOS transistors are connected to the drain of the MN2 NMOS transistor. The MP5 and MP2 PMOS transistors are connected in series between the supply voltage source VDD and the drain of the MN2 NMOS transistor. The gates of the MP5 and MP2 PMOS transistors are connected to the drain of the MN1 NMOS transistor. The MP6 PMOS transistor is connected between the supply voltage VDD and the drain of the MN3 NMOS transistor, and the signal of the inverted output terminal OUTB is supplied to the gate of the MP6 PMOS transistor. The MP7 PMOS transistor is connected between the supply voltage VDD and the drain of the MN4 NMOS transistor, and the signal of the output terminal OUT is supplied to the gate of the MP7 PMOS transistor.

The first latch 630 has an asymmetric structure in which the width of the MN1 NMOS transistor (e.g., 1.8 µm) is twice that of the MN2 NMOS transistor (e.g., 0.9 µm) and the length of the MP6 PMOS transistor is twice (×2) that of the MP7 PMOS transistor. Since the current driving capabilities of the transistors are different from each other during a power-on stage, the MN1 NMOS transistor makes the signal of the inverted output terminal OUTB go low and the MP6 PMOS transistor makes the signal of the input terminal IN go high, thereby setting the signal of the inverted output terminal OUTB in a logic low state. The MP5 and MP2 PMOS transistors set the signal of the output terminal OUT in a logic high state, in response to the signal of the inverted output terminal OUTB that goes low. Accordingly, the output terminal of the first latch 630 is set in a default logic high state.

FIG. 8 is a circuit diagram of an embodiment of the second latch 660, illustrated in FIG. 6, which is set in a default logic low state, according to an aspect of the present invention. Referring to FIG. 8, the second latch 660 has the same structure as the first latch 630 illustrated in FIG. 7 except that the locations of MN1 and MN2 NMOS transistors are switched, the locations of MN3 and MN4 NMOS transistors are switched, and the locations of MP6 and MP7 PMOS transistors are switched. Since the current driving capabilities of the transistors of the second latch 660 are different from each other during a power-on stage, the MN1 NMOS transistor makes the signal of the output terminal OUT go low and the MP6 PMOS transistor makes the signal of the inverted input terminal INB go high, thereby setting the signal of the output terminal OUT in a logic low state. The MP4 and MP3 PMOS transistors set the signal of the inverted output terminal OUTB in a logic high state, in response to the signal of the output terminal OUTPUT that goes low. Thus, the output terminal OUT of the second latch 660 is set in a default logic low state.

Figure 9:
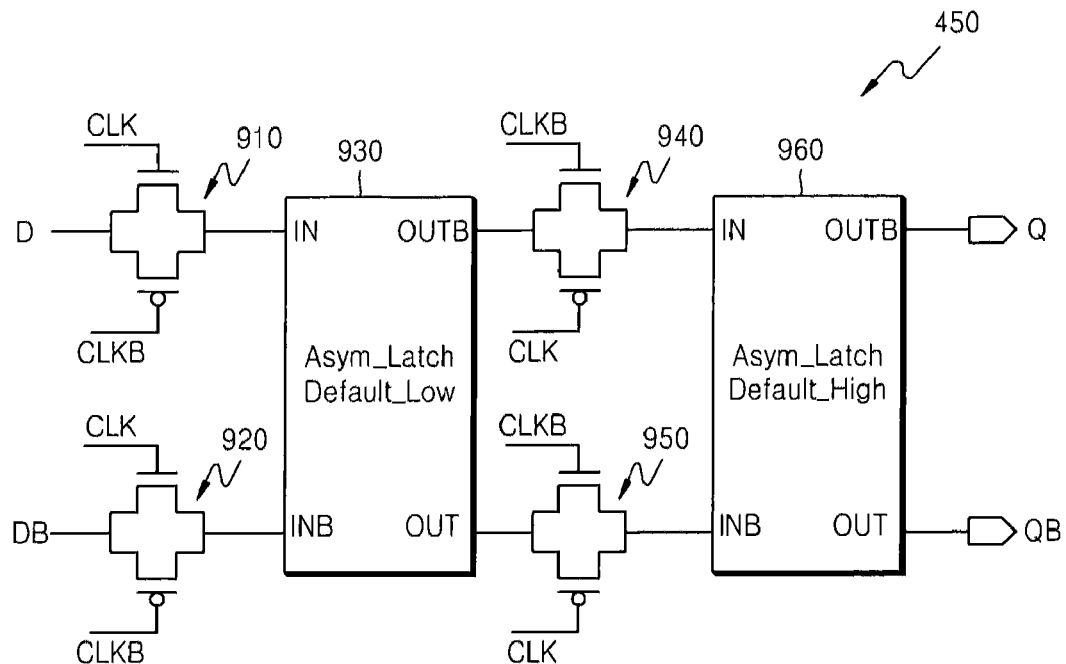
FIG. 9 is a circuit diagram illustrating in detail an embodiment of the fourth flip-flop of FIG. 4, according to an aspect of the present invention.

FIG. 9 is a circuit diagram of an embodiment of the fourth flip-flop 450 illustrated in FIG. 4, according to an aspect of the present invention. Referring to FIG. 9, the fourth flip-flop 450 includes a first switch 910 configured to transmit a signal of a data terminal D in response to a clock terminal signal CLK, and a second switch 920 configured to transmit a signal of an inverted data terminal DB in response to the clock terminal signal CLK. The signal of the data terminal D transmitted via the first switch 910 and the signal of the inverted data terminal DB transmitted via the second switch 920 are respectively supplied to an input terminal IN and an inverted input terminal INB of a first latch 930. The first latch 930 is an asymmetric latch as described above with reference to FIG. 8, and an output terminal OUT of the first latch 930 is set in a default logic low state. A signal of an inverted output terminal OUTB and a signal of an output terminal OUT of the first latch 930 are respectively supplied to an input terminal IN and an inverted input terminal INB of a second latch 960 via third and fourth switches 940 and 950 in response to an inverted clock terminal signal CLKB. The second latch 960 is an asymmetric latch as described above with reference to FIG. 7, and an output terminal OUT of the second latch 960 is set in a default logic low state. A signal of an inverted output terminal OUTB and a signal of an output terminal OUT of the second latch 960 respectively become a signal of the output terminal Q and a signal of the inverted output terminal QB of the fourth flip-flop 450.

Figure 10:
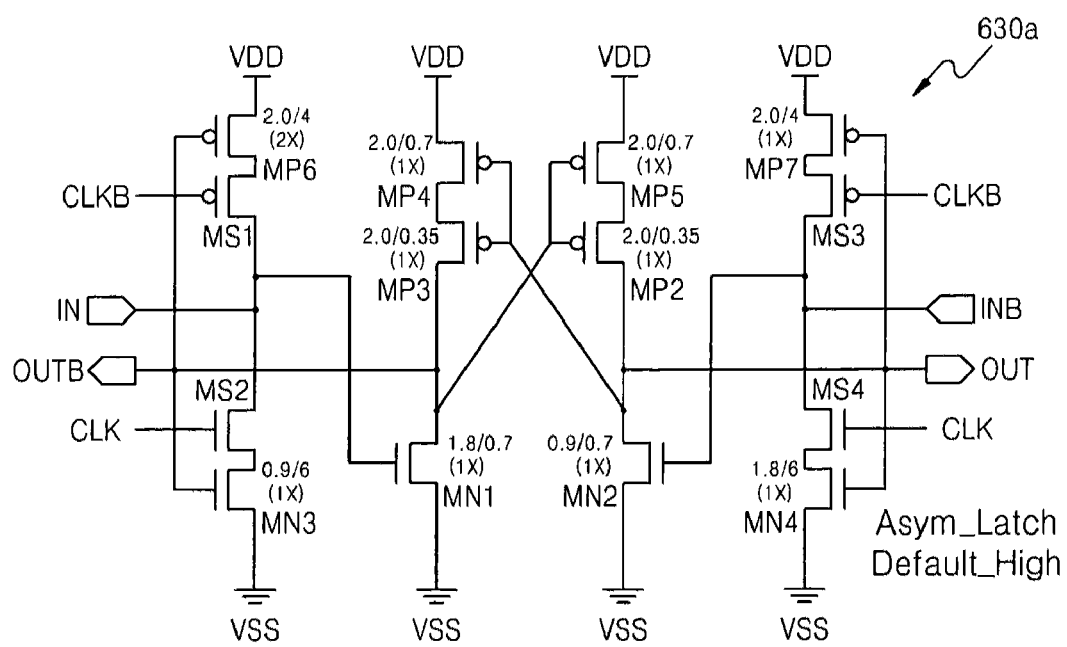
FIG. 10 is a circuit diagram illustrating an embodiment of the first latch illustrated in FIG. 6, according to another aspect of the present invention.

FIG. 10 is a circuit diagram of an embodiment of a first latch 630a set in a default logic high state, which is another embodiment of the first latch 630 illustrated in FIG. 6, according to an aspect of the present invention. Therefore, in the first latch 630a can be used in place of the first latch 630 in FIG. 6. Referring to FIG. 10, the first latch 630a has the same structure as the first latch 630 illustrated in FIG. 7, except that an MS1 PMOS transistor and an MS2 NMOS transistor are further connected between an MP6 PMOS transistor and an MN3 NMOS transistor and an MS3 PMOS transistor and an MS4 NMOS transistor are further connected between an MP7 PMOS transistor and an MN4 NMOS transistor.

The MS1 and MS3 PMOS transistors and the MS2 and MS4 NMOS transistors are turned off in response to a clock signal CLK that goes low. The MS1 through MS4 transistors are used to prevent data transmitted to input terminals IN and INB via the first and second switches 610 and 620 of the first flip-flop 410 (or the second or third flip-flop 420 or 430) illustrated in FIG. 6 from colliding against signals of output terminals OUT and OUTB of the first latch 630a that are connected in the feedback inverter structure. That is, the first latch 630a latches the data transmitted to the input terminal IN and the inverted input terminal INB via the first and second switches 610 and 620 that are turned on in response to the clock signal CLK that goes low. Thereafter, if the first and second switches 610 and 620 are turned off in response to the clock signal CLK that goes high, the MS1 through MS4 transistors of the first latch 630a are turned on, thus connecting the input terminals IN and INB and the output terminals OUT and OUTB in the feedback inverter structure. Accordingly, the input terminals IN and INB of the first latch 630a can be prevented from being floated.

Figure 11:
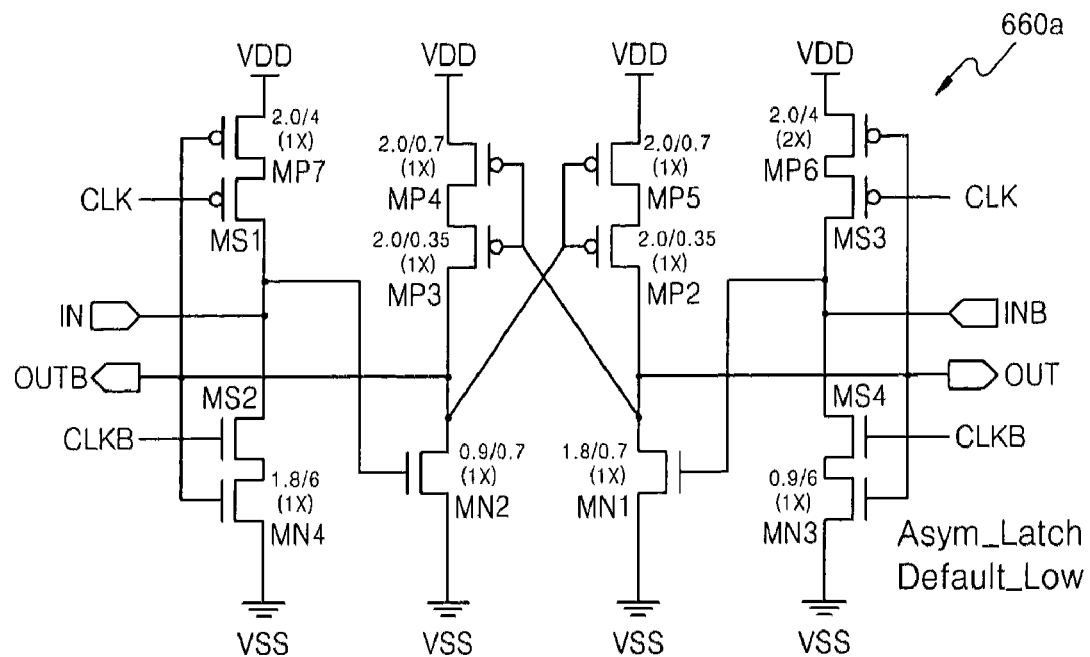
FIG. 11 is a circuit diagram illustrating an embodiment of the second latch illustrated in FIG. 6, according to another aspect of the present invention.

FIG. 11 is a circuit diagram of an embodiment of a second latch 660a set in a default logic low, which is another embodiment of the second latch 660 illustrated in FIG. 6, according to another aspect of the present invention. Therefore, in the second latch 660a can be used in place of the second latch 660 in FIG. 6. Referring to FIG. 11, the second latch 660a has the same structure as the second latch 660 illustrated in FIG. 8, except that an MS1 PMOS transistor and an MS2 NMOS transistor are further connected between an MP7 PMOS transistor and an MN4 NMOS transistor and an MS3 PMOS transistor and an MS4 NMOS transistor are further connected between an MP6 PMOS transistor and an MN3 NMOS transistor.

The MS1 and MS3 PMOS transistors and the MS2 and MS4 NMOS transistors are turned off in response to a clock signal CLK that goes high. The MS1 through MS4 transistors are used to prevent data transmitted to input terminals IN and INB via the third and fourth switches 640 and 650 of the first flip-flop 410 (or the second or third flip-flops 420 or 430) from colliding against signals of output terminals OUT and OUTB of the second latch 660a that are connected in the feedback inverter structure. That is, the second latch 660a latches the data transmitted to the input terminal IN and the inverted input terminal INB via the third and fourth switches 640 and 650 that are turned on in response to the clock signal that goes high. Then, if the third and fourth switches 640 and 650 are turned off in response to the clock signal CLK that goes low, the MS1 through MS4 transistors of the second latch 660a are turned on, thus connecting the input terminals IN and INB and the output terminals OUT and OUTB in the feedback inverter structure. Accordingly, the input terminals IN and INB of the second latch 660a can be prevented from being floated.

Figure 12:
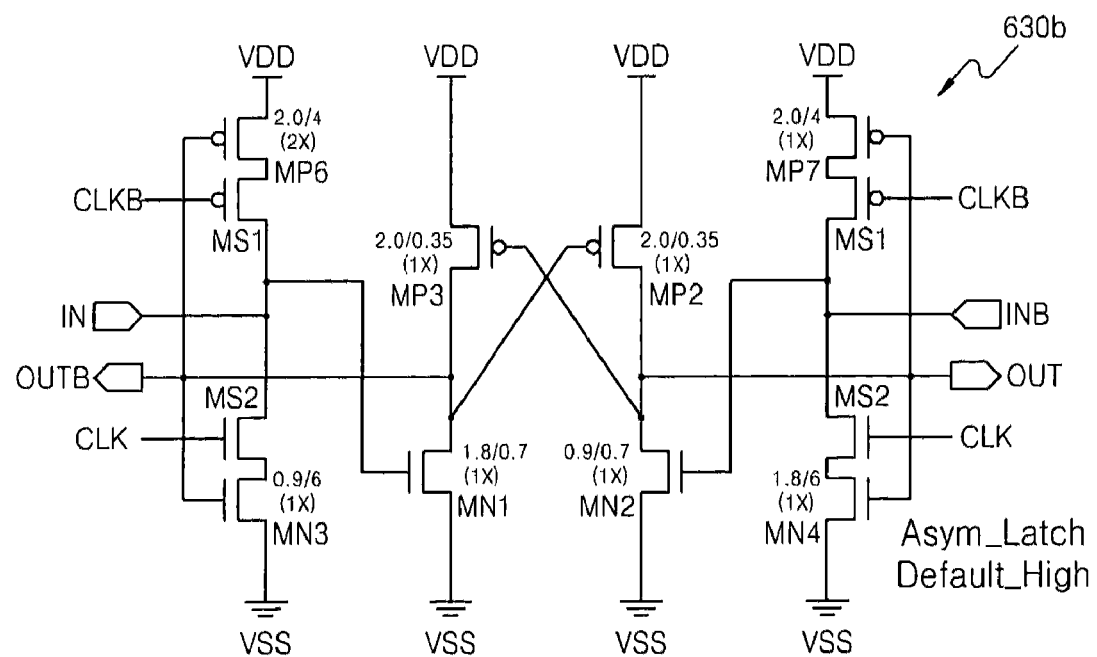
FIG. 12 is a circuit diagram illustrating an embodiment of the first latch illustrated in FIG. 6, according to another aspect of the present invention.

FIG. 12 is a circuit diagram of an embodiment of a first latch 630b set in a default logic high state, which is another embodiment of the first latch 630 illustrated in FIG. 6, according to another aspect of the present invention. Referring to FIG. 12, the first latch 630b has the same structure as the first latch 630a illustrated in FIG. 10 except that an MP3 PMOS transistor is connected directly to a supply voltage source VDD without an MP4 PMOS transistor and an MP2 PMOS transistor is connected directly to the supply voltage source VDD without an MP5 PMOS transistor.

Figure 13:
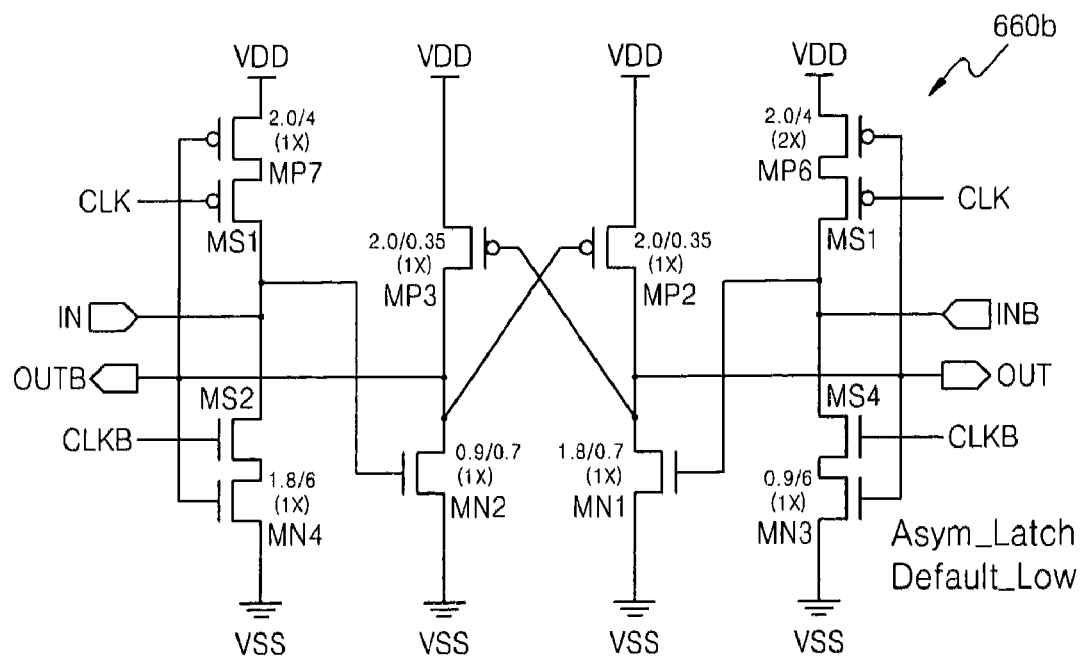
FIG. 13 is a circuit diagram illustrating an embodiment of the second latch illustrated in FIG. 6, according to another aspect of the present invention.

FIG. 13 is a circuit diagram of an embodiment of a second latch 660b set in a default logic low state, which is another embodiment of the second latch 660 illustrated in FIG. 6, according to another aspect of the present invention. Referring to FIG. 13, the second latch 660b has the same structure as the first latch 660a illustrated in FIG. 11 except that an MP3 PMOS transistor is connected directly to a supply voltage source VDD without an MP4 PMOS transistor and an MP2 PMOS transistor is connected directly to the supply voltage source VDD without an MP5 PMOS transistor.

Figure 14:
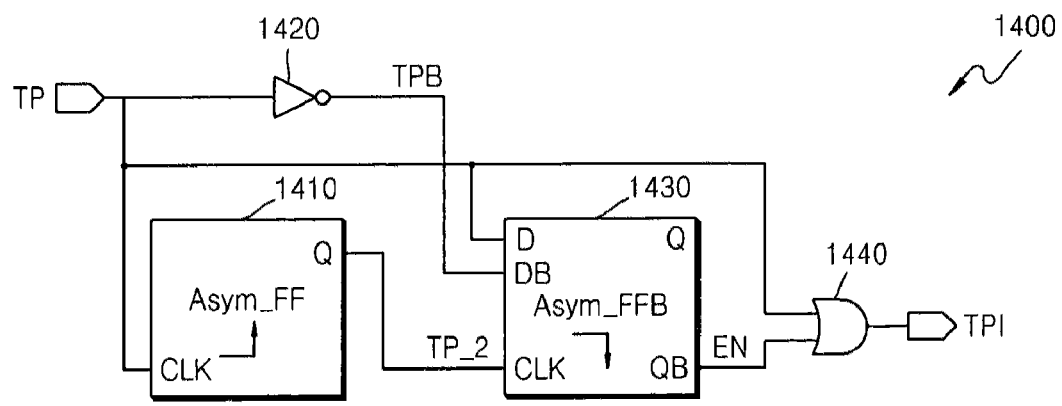
FIG. 14 is a circuit diagram of an embodiment of a masking circuit according to another aspect of the present invention.

FIG. 14 is a circuit diagram of an embodiment of a masking circuit 1400 according to another aspect of the present invention. Referring to FIG. 14, the masking circuit 1400 includes a first flip-flop 1410, an inverter 1420, a second flip-flop 1430, and an OR gate 1440. The first flip-flop 1410 receives a horizontal start pulse signal TP via a clock input terminal CLK, and outputs a divided-by 2 pulse signal TP_2 via an output terminal Q. The inverter 1420 receives and inverts the horizontal start pulse signal TP. The second flip-flop 1430 receives the divided-by 2 pulse signal TP_2 via a clock input terminal CLK, the horizontal start pulse signal TP via a data input terminal D, and an inverted horizontal start pulse signal TPB via an inverted data input terminal DB, and outputs an enable signal EN via an inverted output terminal QB. The OR gate 1440 receives the horizontal start pulse signal TP and the enable signal EN, and generates a horizontal start masking signal TPI. The first flip-flop 1410 can be the same as the flip-flops 410, 420, and 430 described above with reference to FIG. 6, and the second flip-flop 1430 can be the same as the flip-flop 450 described above with reference to FIG. 9.

Figure 15:
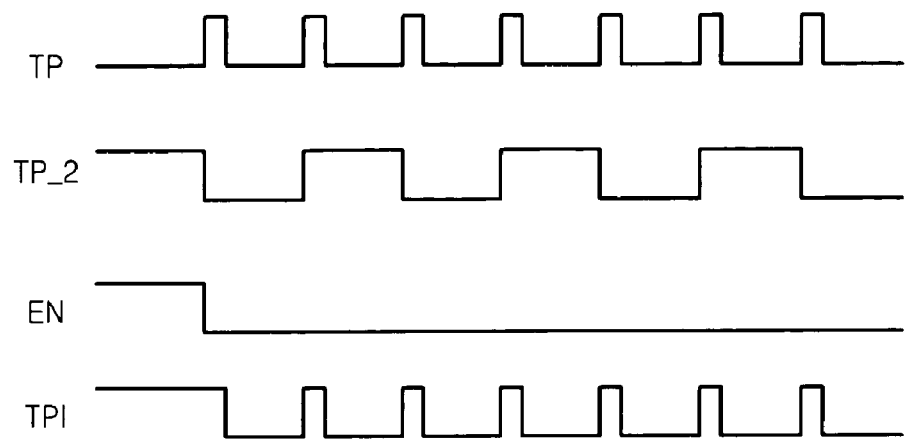
FIG. 15 is an embodiment of an operating timing diagram of the masking circuit of FIG. 14, according to an aspect of the present invention.

FIG. 15 illustrates an embodiment of an operating timing of the masking circuit 1400 illustrated in FIG. 14, according to an aspect of the present invention. Referring to FIG. 15, a horizontal start pulse signal TP output from a timing controller is sequentially input, a divided-by 2 pulse signal TP_2 transitions from an initial logic high level to a logic low level at a rising edge of the horizontal start pulse signal TP. Then, the logic level of the divided-by 2 pulse signal TP_2 is inverted at each rising edge of the horizontal start pulse signal TP. An enable signal EN transitions from an initial logic high level to a logic low level at a falling edge of the divided-by 2 pulse signal TP_2. The horizontal start masking signal TPI is generated by performing an OR operation on the enable signal EN that goes low and the horizontal start pulse signal TP. Accordingly, the horizontal start masking signal TPI that initially goes logic high is generated to have the same logic level as the horizontal start pulse signal TP.

Figure 16:
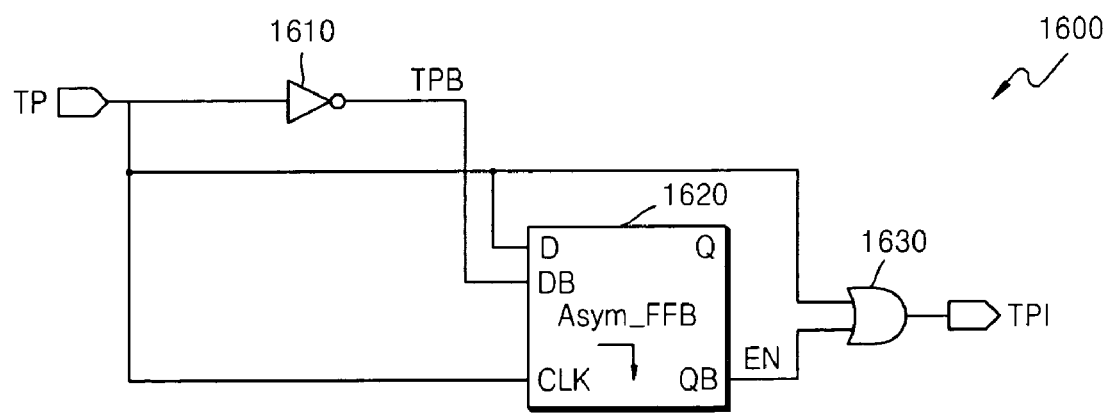
FIG. 16 is a circuit diagram of an embodiment of a masking circuit according to another aspect of the present invention.

FIG. 16 is a circuit diagram of an embodiment of a masking circuit 1600 according to another aspect of the present invention. Referring to FIG. 16, the masking circuit 1600 includes an inverter 1610, a flip-flop 1620, and an OR gate 1630. The inverter 1610 receives and inverts a horizontal start pulse signal TP. The flip-flop 1620 receives the horizontal start pulse signal TP via a clock input terminal CLK, the horizontal start pulse signal TP via a data input terminal D, and an inverted horizontal start pulse signal TPB via an inverted data input terminal DB, and outputs an enable signal EN via an inverted output terminal QB. The OR gate 1630 receives the horizontal start pulse signal TP and the enable signal EN, and generates the horizontal start masking signal TPI. The flip-flop 1620 is the same as the flip-flop 450 described above with reference to FIG. 9.

Figure 17:
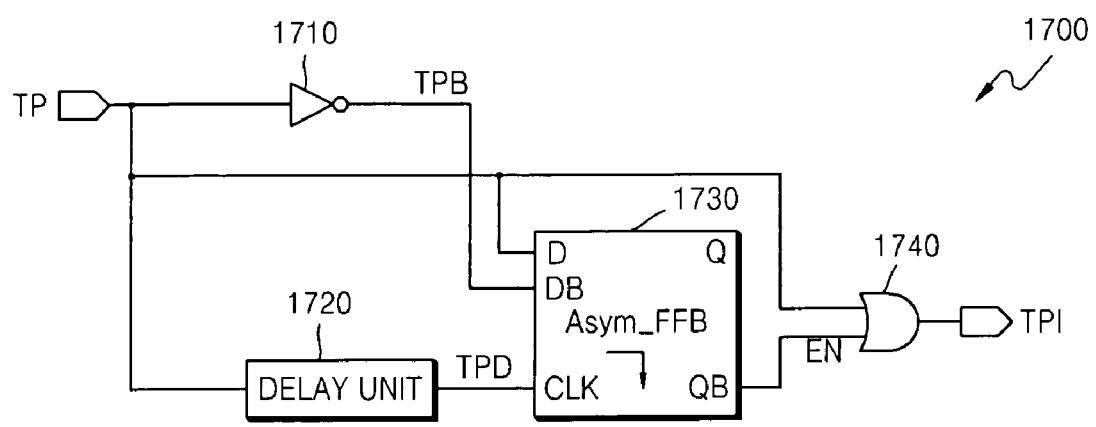
FIG. 17 is a circuit diagram of an embodiment of a masking circuit according to another aspect of the present invention.

FIG. 17 is a circuit diagram of an embodiment of masking circuit 1700 according to another aspect of the present invention. Referring to FIG. 17, the masking circuit 1700 includes an inverter 1710, a delay unit 1720, a flip-flop 1730, and an OR gate 1740. The inverter 1710 receives and inverts a horizontal start pulse signal TP. The delay unit 1720 delays the horizontal start pulse signal TP for a predetermined length of time. The flip-flop 1730 receives the delayed horizontal start pulse signal TPD via a clock input terminal CLK, the horizontal start pulse signal TP via a data input terminal D, and an inverted horizontal start pulse signal TPB via an inverted data input terminal DB, and outputs an enable signal EN via an inverted output terminal QB. The OR gate 1740 receives the horizontal start pulse signal TP and the enable signal EN, and generates a horizontal start masking signal TPI. The flip-flop 1730 is the same as the flip-flop 450 described above with reference to FIG. 9.

Figure 18:
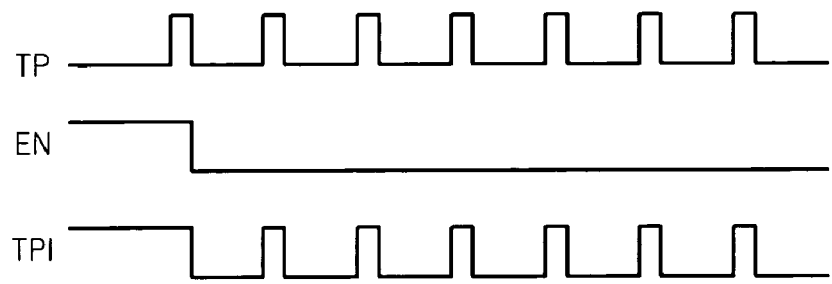
FIG. 18 is an embodiment of an operating timing diagram of the masking circuit of FIG. 16 or 17, according to an aspect of the present invention.

FIG. 18 illustrates an embodiment of the operating timing of the masking circuit 1600 illustrated in FIG. 16 (or the masking circuit 1700 illustrated in FIG. 17) according to aspects of the present invention. Referring to FIG. 18, if a horizontal start pulse signal TP output from a timing controller is sequentially input, an enable signal EN transitions from an initial logic high level to a logic low level at a falling edge of the horizontal start pulse signal TP. The horizontal start masking signal TPI is generated by performing an OR operation on the enable signal EN that goes low and the horizontal start pulse signal. Thus, the horizontal start masking signal TPI that initially goes high is generated to have the same logic level as the horizontal start pulse signal TP.

Figure 19:
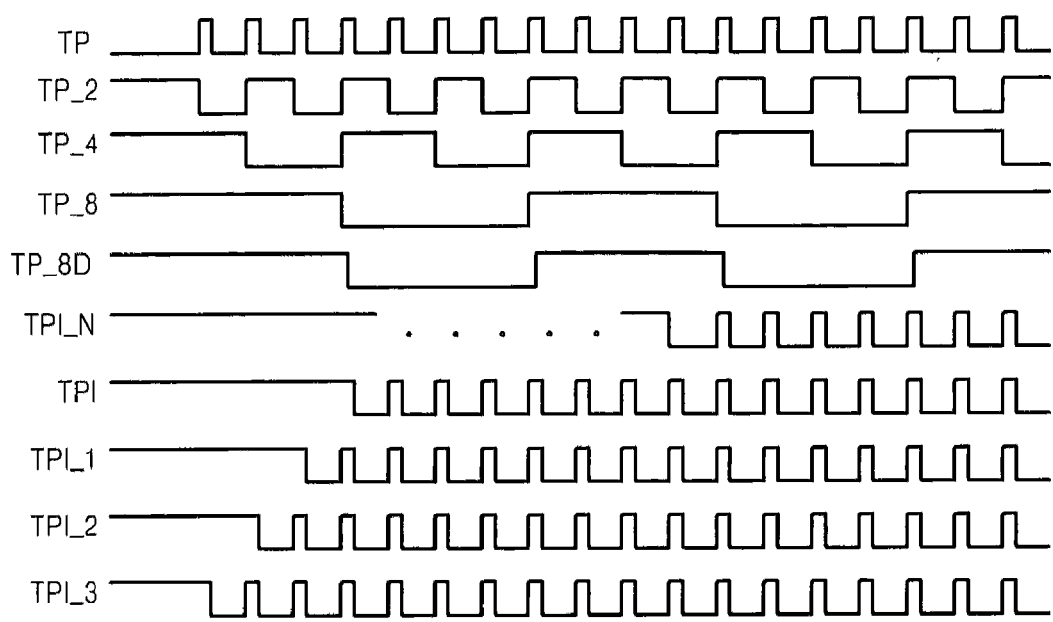
FIG. 19 illustrates embodiments of various timings of a horizontal start-masking signal according to aspects of the present invention.

FIG. 19 illustrates an embodiment of various timings of a horizontal start masking signal TPI according to aspects of the present invention. Referring to FIG. 19, similarly to the above described timing diagram of FIG. 5, if a horizontal start pulse signal TP output from a timing controller is sequentially input, a divided-by 2 pulse signal TP_2, a divided-by 4 pulse signal TP_4, a divided-by 8 pulse signal TP_8, and a delayed divided-by 8 pulse signal TP_8D that initially go high are individually generated. In one embodiment, the horizontal start masking signal TPI, whose logic level changes to be the same as that of the horizontal start pulse signal TP, is generated by masking the first four pulses of the horizontal start pulse signal TP as having a logic high level. In another embodiment, each of the horizontal start masking signals TPI_1, TPI_2, TPI_3, and TPI_N whose logic levels change to be the same as that of the horizontal start pulse signal TP may be respectively generated by masking the first one, two, three, and $2^N$ pulses of the horizontal start pulse signal TP.

Accordingly, according to aspects of the present invention, horizontal start masking signals TPI_1, TPI_2, TPI_3, TPI, and TPI_N prevent unknown image data from being displayed on a liquid crystal during an initial power-on stage.

While exemplary embodiments in accordance aspects of the present invention have been particularly shown and described with reference to the accompanying drawings, it will be understood by those of ordinary skill in the art that various changes in form and details may be made therein without departing from the spirit and scope of the present invention, as defined by the following claims.

What is claimed is:

1. A method of driving a liquid crystal panel, the method comprising:
   supplying power to the liquid crystal panel;
   receiving from a timing controller a horizontal start pulse signal instructing source lines of the liquid crystal panel to be driven;
   generating a horizontal start masking signal by masking at least one pulse of the horizontal start pulse signal, including:
      receiving the horizontal start pulse signal by an inverter, and outputting an inverted horizontal start pulse signal;
      receiving the horizontal start pulse signal via a clock input terminal, the horizontal start pulse signal via a data input terminal, and the inverted horizontal start pulse signal via an inverted data input terminal of a flip-flop, and outputting an enable signal via an inverted output terminal; and
      receiving the horizontal start pulse signal and the enable signal by an OR gate, and generating the horizontal start masking signal; and
   driving the source lines in response to the horizontal start masking signal.

2. The method of claim 1, controlling switches between the source lines of the liquid crystal panel and a source driver with the horizontal start masking signal.

3. The method of claim 2, using the horizontal start masking signal to turn off the switches until signals output from the source driver, which correspond to image data of the liquid crystal panel, are supplied.

4. A method of driving a liquid crystal panel, the method comprising:
   supplying power to the liquid crystal panel;
   sequentially receiving from a timing controller a horizontal start pulse signal instructing source lines of the liquid crystal panel to be driven;
   generating a divided-by 2 pulse signal whose logic level is inverted at each rising edge of the horizontal start pulse signal;
   generating a divided-by 4 pulse signal whose logic level is inverted at each rising edge of the divided-by 2 pulse signal;
   generating a divided-by 8 pulse signal whose logic level is inverted at each rising edge of the divided-by 4 pulse signal;

generating a delayed divided-by 8 pulse signal by delaying the divided-by 8 pulse signal for a predetermined length of time;

generating an enable signal which transitions to logic low at a falling edge of the delayed divided-by 8 pulse signal;

generating a horizontal start masking signal by performing an OR operation on the enable signal and the horizontal start pulse signal; and controlling switches between the source lines of the liquid crystal panel and a source driver, in response to the horizontal start masking signal.

5. The method of claim 4, using the horizontal start masking signal to turn off the switches until signals output from the source driver, which correspond to image data of the liquid crystal panel, are supplied.

6. A masking circuit comprising:

a first flip-flop configured to receive a horizontal start pulse signal via a clock input terminal, and to respectively output a divided-by 2 pulse signal and an inverted divided-by 2 pulse signal via an output terminal and an inverted output terminal;

a second flip-flop configured to receive the divided-by 2 pulse signal via a clock input terminal, and to output a divided-by 4 pulse signal via an output terminal;

a third flip-flop configured to receive the divided-by 4 pulse signal via a clock input terminal, and to output a divided-by 8 pulse signal via an output terminal;

a delay unit configured to delay the divided-by 8 pulse signal for a predetermined length of time, and to output a delayed divided-by 8 pulse signal;

a fourth flip-flop configured to receive the delayed divided-by 8 pulse signal via a clock input terminal, the divided-by 2 pulse signal via a data input terminal, and the inverted divided-by 2 pulse signal via an inverted data input terminal, and to output an enable signal via an inverted output terminal; and an OR gate configured to receive the horizontal start pulse signal and the enable signal, and to generate a horizontal start masking signal.

7. The masking circuit of claim 6, wherein each of the first, second, and third flip-flops comprises:

first and second switches respectively configured to transmit the signals of the inverted output terminal and the output terminal of the flip-flop, in response a signal of an inverted clock input terminal;

a default high latch having an output terminal that is set at a default logic low level, and that is configured to respectively transmit to an input terminal and an inverted input terminal the signal of the inverted output terminal received from the first switch and the signal of the output terminal received from the second switch;

third and fourth switches configured to respectively transmit the signals of the inverted output terminal and the output terminal of the default high latch, in response to a signal of the clock input terminal; and a default low latch having an output terminal that is set at a default logic low level, and that is configured to respectively receive the signal of the inverted output terminal transmitted via the third switch and the signal of the output terminal transmitted via the fourth switch, via an input terminal and an inverted input terminal, where an inverted output terminal and the output terminal of the default low latch are connected to the output terminal and the inverted output terminal of each of the first through third flip-flops.

8. The masking circuit of claim 7, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the first NMOS transistor is greater than the width of the second NMOS transistor, and the size of the fifth PMOS transistor is greater than the size of the sixth PMOS transistor.

9. The masking circuit of claim 7, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the fifth PMOS transistor is greater than the size of the sixth PMOS transistor.

10. The masking circuit of claim 7, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the third PMOS transistor is greater than the size of the fourth PMOS transistor.

11. The masking circuit of claim 7, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the second NMOS transistor is greater than the width of the first NMOS transistor, and the size of the sixth PMOS transistor is greater than the size of the fifth PMOS transistor.

12. The masking circuit of claim 7, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the sixth PMOS transistor is greater than the size of the fifth PMOS transistor.

13. The masking circuit of claim 7, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the fourth PMOS transistor is greater than the size of the third PMOS transistor.

14. The masking circuit of claim 6, wherein the fourth flip-flop comprises:

first and second switches configured to respectively transmit the signals of the data input terminal and the inverted data input terminal of the fourth flip-flop, in response to a signal of the clock input terminal;

a default low latch having an output terminal that is set at a default logic low level, and that is configured to respectively receive the signal of the data input terminal transmitted via the first switch and the signal of the inverted data input terminal transmitted via the second switch, via an input terminal and an inverted input terminal;

third and fourth switches configured to respectively transmit the signals of the inverted output terminal and the output terminal of the default low latch, in response to a signal of the inverted clock input terminal; and a default high latch having an output terminal that is set at a default logic high level, and that is configured to respectively receive the signal of the inverted output terminal transmitted via the third switch and the signal of the output terminal transmitted via the fourth switch, via an input terminal and an inverted input terminal, where an inverted output terminal and the output terminal of the default high latch are connected to the output terminal and the inverted output terminal of the fourth flip-flop.

15. The masking circuit of claim 14, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the first NMOS transistor is greater than the width of the second NMOS transistor, and the size of the fifth PMOS transistor is greater than the size of the sixth PMOS transistor.

16. The masking circuit of claim 14, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the fifth PMOS transistor is greater than the size of the sixth PMOS transistor.

17. The masking circuit of claim 14, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the third PMOS transistor is greater than the size of the fourth PMOS transistor.

18. The masking circuit of claim 14, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the second NMOS transistor is greater than the width of the first NMOS transistor, and the size of the sixth PMOS transistor is greater than the size of the fifth PMOS transistor.

19. The masking circuit of claim 14, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the sixth PMOS transistor is greater than the size of the fifth PMOS transistor.

20. The masking circuit of claim 14, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the fourth PMOS transistor is greater than the size of the fifth PMOS transistor.

21. A masking circuit comprising:

a first flip-flop configured to receive a horizontal start pulse signal via a clock input terminal, and to output a divided-by 2 pulse signal via an output terminal;

an inverter configured to receive the horizontal start pulse signal and to generate an inverted horizontal start pulse signal;

a second flip-flop configured to receive the divided-by 2 pulse signal via a clock input terminal, the horizontal start pulse signal via a data input terminal, and the inverted horizontal start pulse signal via an inverted data input terminal, and to output an enable signal via an inverted output terminal; and an OR gate configured to receive the horizontal start pulse signal and the enable signal, and to generate a horizontal start masking signal.

22. The masking circuit of claim 21, wherein the first flip-flop comprises:

first and second switches configured to respectively transmit a signal of an inverted output terminal and a signal of the output terminal of the first flip-flop, in response to a signal of an inverted clock input terminal;

a default high latch having an output terminal that is set at a default logic high level, and that is configured to respectively receive the signal of the inverted output terminal transmitted via the first switch and the signal of the output terminal transmitted via the second switch, via an input terminal and an inverted input terminal;

third and fourth switches configured to respectively transmit the signals of the inverted output terminal and the output terminal of the default high latch, in response to the signal of the clock input terminal; and a default low latch having an output terminal that is set at a default logic low level, and that is configured to respectively receive the signal of the inverted output terminal transmitted via the third switch and the signal of the output terminal transmitted via the fourth switch, via an input terminal and an inverted input terminal, where an inverted output terminal and the output terminal are connected to the output terminal and the inverted output terminal of the first flip-flop.

23. The masking circuit of claim 22, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the first NMOS transistor is greater than the width of the second NMOS transistor, and the size of the fifth PMOS transistor is greater than the size of the sixth PMOS transistor.

24. The masking circuit of claim 22, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the fifth PMOS transistor is greater than the size of the sixth PMOS transistor.

25. The masking circuit of claim 22, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the third PMOS transistor is greater than the size of the fourth PMOS transistor.

26. The masking circuit of claim 22, wherein the default low latch comprises:
  a first NMOS transistor whose source is connected to a ground voltage source, gate is connected to the input terminal of the default low latch, and drain is connected to the inverted output terminal;
  a second NMOS transistor whose source is connected to the ground voltage source, gate is connected to the inverted input terminal, and drain is connected to the output terminal;
  a third NMOS transistor whose source is connected to the ground voltage source, gate is connected to the inverted output terminal, and drain is connected to the input terminal;
  a fourth NMOS transistor whose source is connected to the ground voltage source, gate is connected to the output terminal, and drain is connected to the inverted input terminal;
  a first PMOS transistor whose source is connected to a supply voltage source and gate is connected to the output terminal;
  a second PMOS transistor whose source is connected to the drain of the first PMOS transistor, gate is connected to the output terminal, and drain is connected to the drain of the first NMOS transistor;
  a third PMOS transistor whose source is connected to the supply voltage source and gate is connected to the inverted output terminal;
  a fourth PMOS transistor whose source is connected to the drain of the third PMOS transistor, gate is connected to the inverted output terminal, and drain is connected to the drain of the second NMOS transistor;
  a fifth PMOS transistor whose source is connected to the supply voltage source, gate is connected to the inverted output terminal, and drain is connected to the drain of the third NMOS transistor; and
  a sixth PMOS transistor whose source is connected to the supply voltage source, gate is connected to the output terminal, and drain is connected to the drain of the fourth NMOS transistor,
  wherein the width of the second NMOS transistor is greater than the width of the first NMOS transistor, and the size of the sixth PMOS transistor is greater than the size of the fifth PMOS transistor.

27. The masking circuit of claim 22, wherein the default low latch comprise:
  a first NMOS transistor whose source is connected to a ground voltage source, gate is connected to the input terminal of the default low latch, and drain is connected to the inverted output terminal;
  a second NMOS transistor whose source is connected to the ground voltage source, gate is connected to the inverted input terminal, and drain is connected to the output terminal;
  a third NMOS transistor whose source is connected to the ground voltage source, gate is connected to the inverted output terminal, and drain is connected to the input terminal;
  a fourth NMOS transistor whose source is connected to the ground voltage source, gate is connected to the output terminal, and drain is connected to the inverted input terminal;
  a first PMOS transistor whose source is connected to a supply voltage source and gate is connected to the output terminal;
  a second PMOS transistor whose source is connected to the drain of the first PMOS transistor, gate is connected to the output terminal, and drain is connected to the drain of the first NMOS transistor;
  a third PMOS transistor whose source is connected to the supply voltage source and gate is connected to the inverted output terminal;
  a fourth PMOS transistor whose source is connected to the drain of the third PMOS transistor, gate is connected to the inverted output terminal, and drain is connected to the drain of the second NMOS transistor;
  a fifth PMOS transistor whose source is connected to the supply voltage source and gate is connected to the inverted output terminal;
  a first switching PMOS transistor whose source is connected to the drain of the fifth PMOS transistor, gate is connected to the clock input terminal, and drain is connected to the input terminal;
  a first switching NMOS transistor whose drain is connected to the drain of the first switching PMOS transistor, gate is connected to the inverted clock input terminal, and source is connected to the drain of the third NMOS transistor;
  a sixth PMOS transistor whose source is connected to the supply voltage source and gate is connected to the output terminal;
  a second switching PMOS transistor whose source is connected to the drain of the sixth PMOS transistor, gate is connected to the clock input terminal, and drain is connected to the inverted input terminal; and
  a second switching NMOS transistor whose drain is connected to the drain of the second switching PMOS transistor, gate is connected to the inverted clock input terminal, and source is connected to the drain of the fourth NMOS transistor,
  wherein the width of the second NMOS transistor is greater than the width of the first NMOS transistor, and the size of the sixth PMOS transistor is greater than the size of the fifth PMOS transistor.

28. The masking circuit of claim 22, wherein the default low latch comprises:
  a first NMOS transistor whose source is connected to a ground voltage source, gate is connected to the input terminal of the default low latch, and drain is connected to the inverted output terminal;
  a second NMOS transistor whose source is connected to the ground voltage source, gate is connected to the inverted input terminal, and drain is connected to the output terminal;
  a third NMOS transistor whose source is connected to the ground voltage source, gate is connected to the inverted output terminal, and drain is connected to the input terminal;
  a fourth NMOS transistor whose source is connected to the ground voltage source, gate is connected to the output terminal, and drain is connected to the inverted input terminal;
  a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the fourth PMOS transistor is greater than the size of the fifth PMOS transistor.

29. The masking circuit of claim 21, wherein the second flip-flop comprises:

first and second switches configured to respectively transmit the signals of the data input terminal and the inverted data input terminal of the second flip-flop, in response to the signal of the clock input terminal;

a default low latch having an output terminal that is set at a default logic low level, and that is configured to respectively receive the signal of the data input terminal transmitted via the first switch and the signal of the inverted data input terminal transmitted via the second switch, via an input terminal and an inverted input terminal;

third and fourth switches configured to respectively transmit the signals of the inverted output terminal and the output terminal of the default low latch, in response to a signal of an inverted clock input terminal; and a default high latch having an output terminal that is set at a default logic high level, and that is configured to respectively receive the signal of the inverted output terminal transmitted via the third switch and the signal of the output terminal transmitted via the fourth switch, via an input terminal and an inverted input terminal, wherein an inverted output terminal and the output terminal are connected to the output terminal and the inverted output terminal of the second flip-flop.

30. The masking circuit of claim 29, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the first NMOS transistor is greater than the width of the second NMOS transistor, and the size of the fifth PMOS transistor is greater than the size of the sixth PMOS transistor.

31. The masking circuit of claim 29, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the fifth PMOS transistor is greater than the size of the sixth PMOS transistor.

32. The masking circuit of claim 29, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the third PMOS transistor is greater than the size of the fourth PMOS transistor.

33. The masking circuit of claim 29, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the second NMOS transistor is greater than the width of the first NMOS transistor, and the size of the sixth PMOS transistor is greater than the size of the fifth PMOS transistor.

34. The masking circuit of claim 29, wherein the default low latch comprise:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the sixth PMOS transistor is greater than the size of the fifth PMOS transistor.

35. The masking circuit of claim 29, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the fourth PMOS transistor is greater than the size of the third PMOS transistor.

36. A masking circuit comprising:

an inverter configured to receive a horizontal start pulse signal and to output an inverted horizontal start pulse signal;

a flip-flop configured to receive the horizontal start pulse signal via a clock input terminal, the horizontal start pulse signal via a data input terminal, and the inverted horizontal start pulse signal via an inverted data input terminal, and to output an enable signal via an inverted output terminal; and an OR gate configured to receive the horizontal start pulse signal and the enable signal, and to generate a horizontal start masking signal.

37. The masking circuit of claim 36, wherein the flip-flop comprises:

first and second switches configured to respectively transmit signals of the data input terminal and the inverted data input terminal of the flip-flop, in response to a signal of the clock input terminal;

a default low latch having an output terminal that is set at a default logic low level, and that is configured to respectively receive a signal of the data input terminal transmitted via the first switch and the signal of the inverted data input terminal transmitted via the second switch, via an input terminal and an inverted input terminal;
third and fourth switches configured to respectively transmit signals of the inverted output terminal and the output terminal of the default low latch, in response to a signal of an inverted clock input terminal; and
a default high latch having an output terminal that is set in a default logic high level, and that is configured to respectively receive the signal of the inverted output terminal transmitted via the third switch and the signal of the output terminal transmitted via the fourth switch, via an input terminal and an inverted input terminal, where an inverted output terminal and the output terminal are connected to the output terminal and the inverted output terminal of the flip-flop.

38. The masking circuit of claim 37, wherein the default high latch comprises:
a first NMOS transistor whose source is connected to a ground voltage source, gate is connected to the input terminal of the default high latch, and drain is connected to the inverted output terminal;
a second NMOS transistor whose source is connected to the ground voltage source, gate is connected to the inverted input terminal, and drain is connected to the output terminal;
a third NMOS transistor whose source is connected to the ground voltage source, gate is connected to the inverted output terminal, and drain is connected to the input terminal;
a fourth NMOS transistor whose source is connected to the ground voltage source, gate is connected to the output terminal, and drain is connected to the inverted input terminal;
a first PMOS transistor whose source is connected to a supply voltage source and gate is connected to the output terminal;
a second PMOS transistor whose source is connected to the drain of the first PMOS transistor, gate is connected to the output terminal, and drain is connected to the drain of the first NMOS transistor;
a third PMOS transistor whose source is connected to the supply voltage source and gate is connected to the inverted output terminal;
a fourth PMOS transistor whose source is connected to the drain of the third PMOS transistor, gate is connected to the inverted output terminal, and drain is connected to the drain of the second NMOS transistor;
a fifth PMOS transistor whose source is connected to the supply voltage source, gate is connected to the inverted output terminal, and drain is connected to the drain of the third NMOS transistor; and
a sixth PMOS transistor whose source is connected to the supply voltage source, gate is connected to the output terminal, and drain is connected to the drain of the fourth NMOS transistor,
wherein the width of the first NMOS transistor is greater than the width of the second NMOS transistor, and the size of the fifth PMOS transistor is greater than the size of the sixth PMOS transistor.

39. The masking circuit of claim 37, wherein the default high latch comprises:
a first NMOS transistor whose source is connected to a ground voltage source, gate is connected to the input terminal of the default high latch, and drain is connected to the inverted output terminal;
a second NMOS transistor whose source is connected to the ground voltage source, gate is connected to the inverted input terminal, and drain is connected to the output terminal;
a third NMOS transistor whose source is connected to the ground voltage source, gate is connected to the inverted output terminal, and drain is connected to the input terminal;
a fourth NMOS transistor whose source is connected to the ground voltage source, gate is connected to the output terminal, and drain is connected to the inverted input terminal;
a first PMOS transistor whose source is connected to a supply voltage source and gate is connected to the output terminal;
a second PMOS transistor whose source is connected to the drain of the first PMOS transistor, gate is connected to the output terminal, and drain is connected to the drain of the first NMOS transistor;
a third PMOS transistor whose source is connected to the supply voltage source and gate is connected to the inverted output terminal;
a fourth PMOS transistor whose source is connected to the drain of the third PMOS transistor, gate is connected to the inverted output terminal, and drain is connected to the drain of the second NMOS transistor;
a fifth PMOS transistor whose source is connected to the supply voltage source and gate is connected to the inverted output terminal;
a first switching PMOS transistor whose source is connected to the drain of the fifth PMOS transistor, gate is connected to the inverted clock input terminal, and drain is connected to the input terminal;
a first switching NMOS transistor whose drain is connected to the drain of the first switching PMOS transistor, gate is connected to the clock input terminal, and source is connected to the drain of the third NMOS transistor;
a sixth PMOS transistor whose source is connected to the supply voltage source and gate is connected to the output terminal;
a second switching PMOS transistor whose source is connected to the drain of the sixth PMOS transistor, gate is connected to the inverted clock input terminal, and drain is connected to the inverted input terminal; and
a second switching NMOS transistor whose drain is connected to the drain of the second switching PMOS transistor, gate is connected to the clock input terminal, and source is connected to the drain of the fourth NMOS transistor,
wherein the width of the first NMOS transistor is greater than the width of the second NMOS transistor, and the size of the fifth PMOS transistor is greater than the size of the sixth PMOS transistor.

40. The masking circuit of claim 37, wherein the default high latch comprises:
a first NMOS transistor whose source is connected to a ground voltage source, gate is connected to the input terminal of the default high latch, and drain is connected to the inverted output terminal;
a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;
a fourth NMOS transistor whose source is connected to the ground voltage source, gate is connected to the output terminal, and drain is connected to the inverted input terminal;
a first PMOS transistor whose source is connected to a supply voltage source, gate is connected to the output terminal, and drain is connected to the drain of the first NMOS transistor;
a second PMOS transistor whose source is connected to the supply voltage source, gate is connected to the inverted output terminal, and drain is connected to the drain of the second NMOS transistor;
a third PMOS transistor whose source is connected to the supply voltage source and gate is connected to the inverted output terminal;
a first switching PMOS transistor whose source is connected to the drain of the third PMOS transistor, gate is connected to the inverted clock input terminal, and drain is connected to the input terminal;
a first switching NMOS transistor whose drain is connected to the drain of the first switching PMOS transistor, gate is connected to the clock input terminal, and source is connected to the drain of the third NMOS transistor;
a fourth PMOS transistor whose source is connected to the supply voltage source and gate is connected to the output terminal;
a second switching PMOS transistor whose source is connected to the drain of the fourth PMOS transistor, gate is connected to the inverted clock input terminal, and drain is connected to the inverted input terminal; and
a second switching NMOS transistor whose drain is connected to the drain of the second switching PMOS transistor, gate is connected to the clock input terminal, and source is connected to the drain of the fourth NMOS transistor,
wherein the width of the first NMOS transistor is greater than the width of the second NMOS transistor, and the size of the third PMOS transistor is greater than the size of the fourth PMOS transistor.

41. The masking circuit of claim 37, wherein the default low latch comprises:
a first NMOS transistor whose source is connected to a ground voltage source, gate is connected to the input terminal of the default low latch, and drain is connected to the inverted output terminal;
a second NMOS transistor whose source is connected to the ground voltage source, gate is connected to the inverted input terminal, and drain is connected to the output terminal;
a third NMOS transistor whose source is connected to the ground voltage source, gate is connected to the inverted output terminal, and drain is connected to the input terminal;
a fourth NMOS transistor whose source is connected to the ground voltage source, gate is connected to the output terminal, and drain is connected to the inverted input terminal;
a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;
a third PMOS transistor whose source is connected to the supply voltage source and gate is connected to the inverted output terminal;
a fourth PMOS transistor whose source is connected to the drain of the third PMOS transistor, gate is connected to the inverted output terminal, and drain is connected to the drain of the second NMOS transistor;
a fifth PMOS transistor whose source is connected to the supply voltage source, gate is connected to the inverted output terminal, and drain is connected to the drain of the third NMOS transistor; and
a sixth PMOS transistor whose source is connected to the supply voltage source, gate is connected to the output terminal, and drain is connected to the drain of the fourth NMOS transistor,
wherein the width of the second NMOS transistor is greater than the width of the first NMOS transistor, and the size of the sixth PMOS transistor is greater than the size of the fifth PMOS transistor.

42. The masking circuit of claim 37, wherein the default low latch comprises:
a first NMOS transistor whose source is connected to a ground voltage source, gate is connected to the input terminal of the default low latch, and drain is connected to the inverted output terminal;
a second NMOS transistor whose source is connected to the ground voltage source, gate is connected to the inverted input terminal, and drain is connected to the output terminal;
a third NMOS transistor whose source is connected to the ground voltage source, gate is connected to the inverted output terminal, and drain is connected to the input terminal;
a fourth NMOS transistor whose source is connected to the ground voltage source, gate is connected to the output terminal, and drain is connected to the inverted input terminal;
a first PMOS transistor whose source is connected to a supply voltage source and gate is connected to the output terminal;
a second PMOS transistor whose source is connected to the drain of the first PMOS transistor, gate is connected to the output terminal, and drain is connected to the drain of the first NMOS transistor;
a third PMOS transistor whose source is connected to the supply voltage source and gate is connected to the inverted output terminal;
a fourth PMOS transistor whose source is connected to the drain of the third PMOS transistor, gate is connected to the inverted output terminal, and drain is connected to the drain of the second NMOS transistor;
a fifth PMOS transistor whose source is connected to the supply voltage source and gate is connected to the inverted output terminal;
a first switching PMOS transistor whose source is connected to the drain of the fifth PMOS transistor, gate is connected to the clock input terminal, and drain is connected to the input terminal;
a first switching NMOS transistor whose drain is connected to the drain of the first switching PMOS transistor, gate is connected to the inverted clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the sixth PMOS transistor is greater than the size of the fifth PMOS transistor.

43. The masking circuit of claim 37, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the fourth PMOS transistor is greater than the size of the fifth PMOS transistor.

44. The masking circuit of claim 36, further comprising a delay unit configured to receive the horizontal start pulse signal and to generate a delayed horizontal start pulse signal, wherein the delayed horizontal start pulse signal is supplied to the clock input terminal of the flip-flop.

45. The masking circuit of claim 44, wherein the flip-flop comprises:

first and second switches configured to respectively transmit signals of the data input terminal and the inverted data input terminal of the flip-flop, in response to a signal of the clock input terminal;

a default low latch having an output terminal that is set at a default logic low level, and that is configured to respectively receive a signal of the data input terminal transmitted via the first switch and the signal of the inverted data input terminal transmitted via the second switch, via an input terminal and an inverted input terminal;

third and fourth switches configured to respectively transmit signals of the inverted output terminal and the output terminal of the default low latch, in response to a signal of an inverted clock input terminal; and a default high latch having an output terminal that is set in a default logic high level, and that is configured to respectively receive the signal of the inverted output terminal transmitted via the third switch and the signal of the output terminal transmitted via the fourth switch, via an input terminal and an inverted input terminal, where an inverted output terminal and the output terminal are connected to the output terminal and the inverted output terminal of the flip-flop.

46. The masking circuit of claim 45, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the first NMOS transistor is greater than the width of the second NMOS transistor, and the size of the fifth PMOS transistor is greater than the size of the sixth PMOS transistor.

47. The masking circuit of claim 45, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the fifth PMOS transistor is greater than the size of the sixth PMOS transistor.

48. The masking circuit of claim 45, wherein the default high latch comprises:

a first NMOS transistor whose source is connected to a ground voltage source, gate is connected to the input terminal of the default high latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the inverted clock input terminal, and drain is connected to the input terminal;

a first switching NMOS transistor whose drain is connected to the drain of the first switching PMOS transistor, gate is connected to the clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the inverted clock input terminal, and drain is connected to the inverted input terminal; and a second switching NMOS transistor whose drain is connected to the drain of the second switching PMOS transistor, gate is connected to the clock input terminal, and source is connected to the drain of the fourth NMOS transistor, wherein the width of the first NMOS transistor is greater than the width of the second NMOS transistor, and the size of the third PMOS transistor is greater than the size of the fourth PMOS transistor.

49. The masking circuit of claim 45, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source, gate is connected to the inverted output terminal, and drain is connected to the drain of the third NMOS transistor; and a sixth PMOS transistor whose source is connected to the supply voltage source, gate is connected to the output terminal, and drain is connected to the drain of the fourth NMOS transistor, wherein the width of the second NMOS transistor is greater than the width of the first NMOS transistor, and the size of the sixth PMOS transistor is greater than the size of the fifth PMOS transistor.

50. The masking circuit of claim 45, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source and gate is connected to the output terminal;

a second PMOS transistor whose source is connected to the drain of the first PMOS transistor, gate is connected to the output terminal, and drain is connected to the drain of the first NMOS transistor;

a third PMOS transistor whose source is connected to the supply voltage source and gate is connected to the inverted output terminal;

a fourth PMOS transistor whose source is connected to the drain of the third PMOS transistor, gate is connected to the inverted output terminal, and drain is connected to the drain of the second NMOS transistor;

a fifth PMOS transistor whose source is connected to the supply voltage source and gate is connected to the inverted output terminal;

a first switching PMOS transistor whose source is connected to the drain of the fifth PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a sixth PMOS transistor whose source is connected to the supply voltage source and gate is connected to the output terminal;

a second switching PMOS transistor whose source is connected to the drain of the sixth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the sixth PMOS transistor is greater than the size of the fifth PMOS transistor.

51. The masking circuit of claim 45, wherein the default low latch comprises:

a first NMOS transistor whose source is connected to a ground voltage source, gate is connected to the input terminal of the default low latch, and drain is connected to the inverted output terminal;

a second NMOS transistor whose source is connected to the ground voltage source, gate is connected to the inverted input terminal, and drain is connected to the output terminal;

a third NMOS transistor whose source is connected to the ground voltage source, gate is connected to the inverted output terminal, and drain is connected to the input terminal;

a fourth NMOS transistor whose source is connected to the ground voltage source, gate is connected to the output terminal, and drain is connected to the inverted input terminal;

a first PMOS transistor whose source is connected to a supply voltage source, gate is connected to the output terminal, and drain is connected to the drain of the first NMOS transistor;

a second PMOS transistor whose source is connected to the supply voltage source, gate is connected to the inverted output terminal, and drain is connected to the drain of the second NMOS transistor;

a third PMOS transistor whose source is connected to the supply voltage source and gate is connected to the inverted output terminal;

a first switching PMOS transistor whose source is connected to the drain of the third PMOS transistor, gate is connected to the clock input terminal, and drain is connected to the input terminal;

a first switching NMOS transistor whose drain is connected to the drain of the first switching PMOS transistor, gate is connected to the inverted clock input terminal, and source is connected to the drain of the third NMOS transistor;

a fourth PMOS transistor whose source is connected to the supply voltage source and gate is connected to the output terminal;

a second switching PMOS transistor whose source is connected to the drain of the fourth PMOS transistor, gate is connected to the clock input terminal, and drain is connected to the inverted input terminal; and a second switching NMOS transistor whose drain is connected to the drain of the second switching PMOS transistor, gate is connected to the inverted clock input terminal, and source is connected to the drain of the fourth NMOS transistor, wherein the width of the second NMOS transistor is greater than the width of the first NMOS transistor, and the size of the fourth PMOS transistor is greater than the size of the third PMOS transistor.

* * * * *